(12) United States Patent
Subramanian

(10) Patent No.: US 7,704,849 B2
(45) Date of Patent: Apr. 27, 2010

(54) METHODS OF FORMING TRENCH ISOLATION IN SILICON OF A SEMICONDUCTOR SUBSTRATE BY PLASMA

(75) Inventor: Krupakar M. Subramanian, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/949,643

(22) Filed: Dec. 3, 2007

(65) Prior Publication Data

US 2009/0142902 A1 Jun. 4, 2009

(51) Int. Cl.
*H01L 21/76* (2006.01)
(52) U.S. Cl. .................. 438/400; 257/E21.54
(58) Field of Classification Search .......... 257/594, 257/910, E21.54; 438/979, 983, 400
See application file for complete search history.

(56) References Cited

U.S. PATENT DOCUMENTS

| | | | |
|---|---|---|---|
| 6,020,091 A | 2/2000 | Lee | |
| 6,284,623 B1 | 9/2001 | Zhang et al. | |
| 6,303,513 B1 * | 10/2001 | Khan et al. | 438/714 |
| 6,372,151 B1 * | 4/2002 | Shin et al. | 216/67 |
| 6,413,438 B1 | 7/2002 | Ikegami | |
| 6,437,383 B1 * | 8/2002 | Xu | 257/300 |
| 6,583,065 B1 | 6/2003 | Williams et al. | |
| 6,942,816 B2 | 9/2005 | Rusu et al. | |
| 7,078,334 B1 | 7/2006 | Chowdhury et al. | |
| 7,084,024 B2 * | 8/2006 | Gluschenkov et al. | 438/199 |
| 7,285,433 B2 * | 10/2007 | Kretchmer et al. | 438/24 |
| 2002/0175144 A1 | 11/2002 | Hung et al. | |
| 2006/0011910 A1 | 1/2006 | Campbell | |
| 2006/0024886 A1 * | 2/2006 | Ferrant et al. | 438/257 |
| 2006/0115909 A1 | 6/2006 | Happ | |
| 2007/0117399 A1 * | 5/2007 | Del Puppo et al. | 438/710 |
| 2008/0128799 A1 * | 6/2008 | Park et al. | 257/330 |

FOREIGN PATENT DOCUMENTS

| | | |
|---|---|---|
| JP | 05-055178 | 3/1993 |
| JP | 09-186139 | 7/1997 |

OTHER PUBLICATIONS

Lin, "Multi-Layer Resist Systems as a Means to Submicron Optical Lithography", IEDM, (1982): p. 391-395.*
WO PCT/US2008/082719, Apr. 22, 2009, Written Opinion.
WO PCT/2008/082719, Apr. 22, 2009, Search Report.

* cited by examiner

*Primary Examiner*—Matthew Smith
*Assistant Examiner*—Michele Fan
(74) *Attorney, Agent, or Firm*—Wells St. John P.S.

(57) ABSTRACT

A method of etching trenches into silicon of a semiconductor substrate includes forming a mask over silicon of a semiconductor substrate, with the mask comprising trenches formed there-through. Plasma etching is conducted to form trenches into the silicon of the semiconductor substrate using the mask. In one embodiment, the plasma etching includes forming an etching plasma using precursor gases which include $SF_6$, an oxygen-containing compound, and a nitrogen-containing compound. In one embodiment, the plasma etching includes an etching plasma which includes a sulfur-containing component, an oxygen-containing component, and $NF_x$.

20 Claims, 26 Drawing Sheets

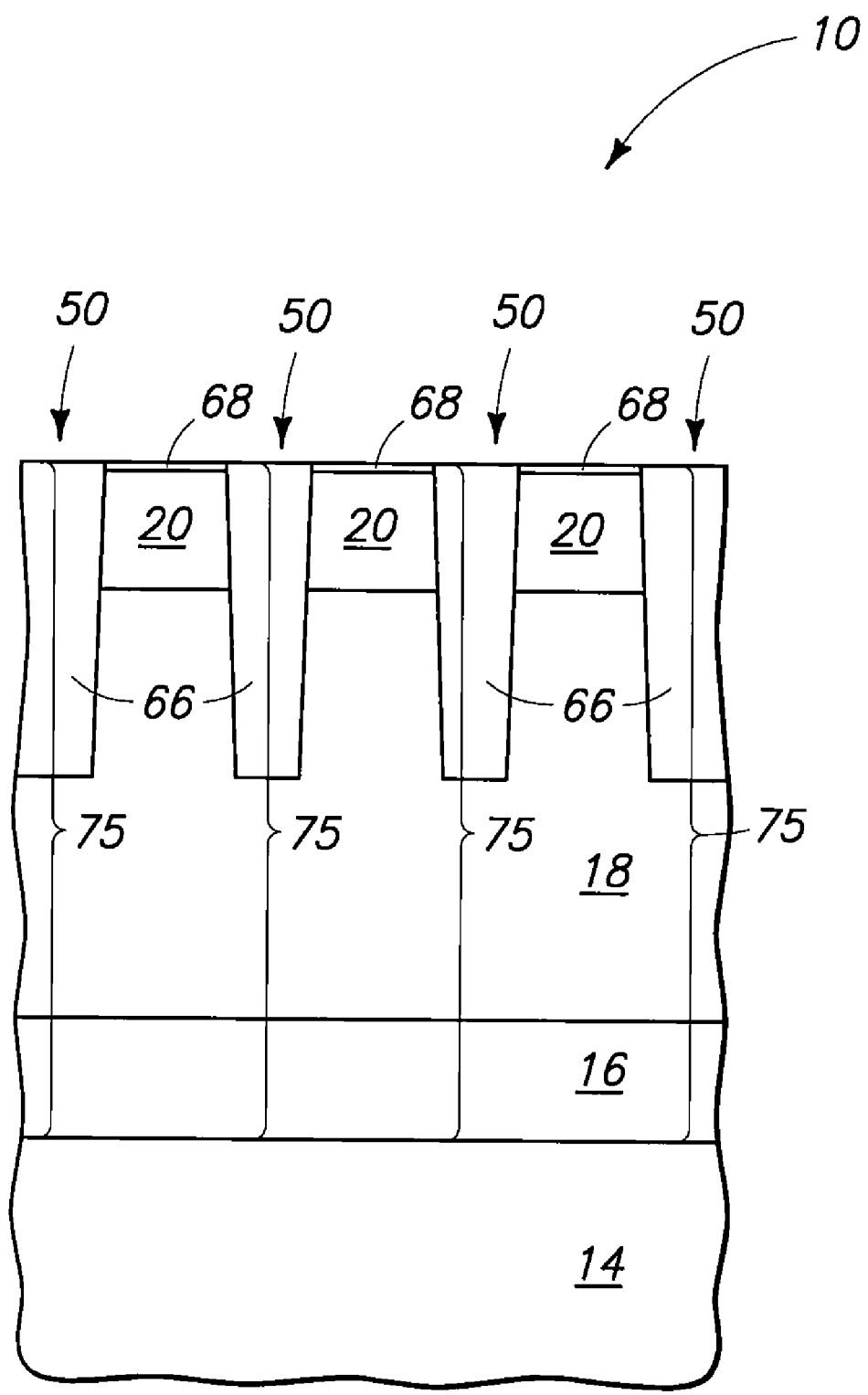
F I G 2 6

METHODS OF FORMING TRENCH ISOLATION IN SILICON OF A SEMICONDUCTOR SUBSTRATE BY PLASMA

TECHNICAL FIELD

Embodiments disclosed herein pertain to methods of etching trenches into silicon of a semiconductor substrate, to methods of forming trench isolation in silicon of a semiconductor substrate, and to methods of forming a plurality of diodes.

BACKGROUND

In the fabrication of integrated circuitry, numerous devices are packed into a small area of a semiconductor substrate to create an integrated circuit. Many of the individual devices are electrically isolated from one another. Accordingly, electrical isolation is an integral part of semiconductor device design for preventing unwanted electrical coupling between adjacent components and devices.

As the size of integrated circuits is reduced, the devices that make up the circuits are positioned closer together. Conventional methods of isolating circuit components include trench isolation. Such occurs by etching trenches into a semiconductor substrate and filling the trenches with insulative material. As the density of components on the semiconductor substrate has increased, the widths of the trenches have decreased. Further, the depths of the trenches have tended to increase. One type of semiconductor substrate material within which isolation trenches are formed is crystalline silicon, and which may include other materials such as germanium and/or conductivity modifying dopants. A need remains for developing improved etching chemistries which enable trenches to be etched into silicon, for example in the fabrication of trench isolation.

BRIEF DESCRIPTION OF THE DRAWINGS

FIG. 26 is a sectional view of the FIG. 25 substrate taken through line 26-26 in FIG. 24.

DETAILED DESCRIPTION OF EXAMPLE EMBODIMENTS

Embodiments of the invention include methods of etching trenches into silicon of the semiconductor substrate, and also methods of forming trench isolation in silicon of the semiconductor substrate. Further, embodiments of the invention also include methods of forming a plurality of diodes.

Figure 1:
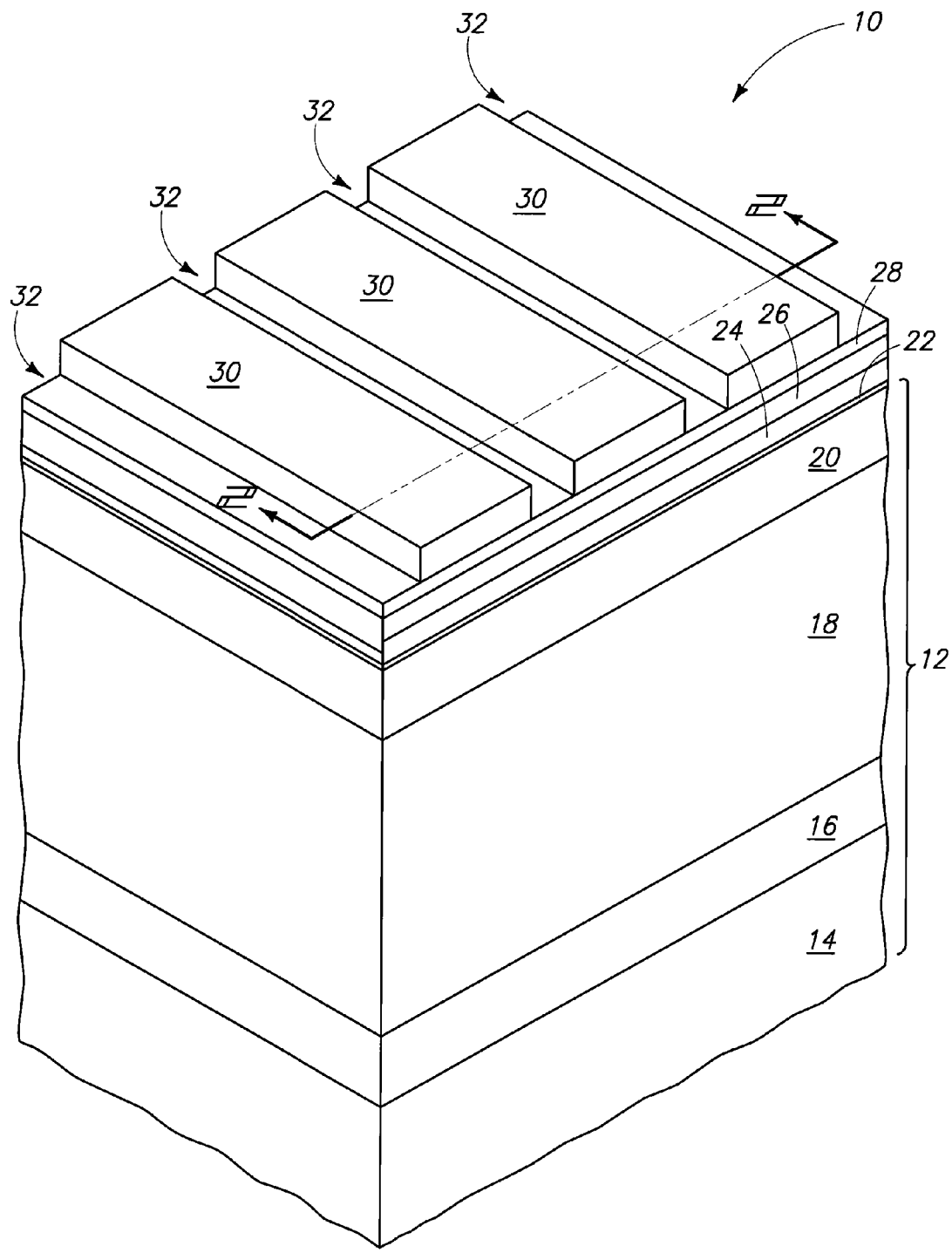
FIG. 1 is a diagrammatic isometric view of a portion of a semiconductor substrate in process in accordance with an embodiment of the invention.
Figure 2:
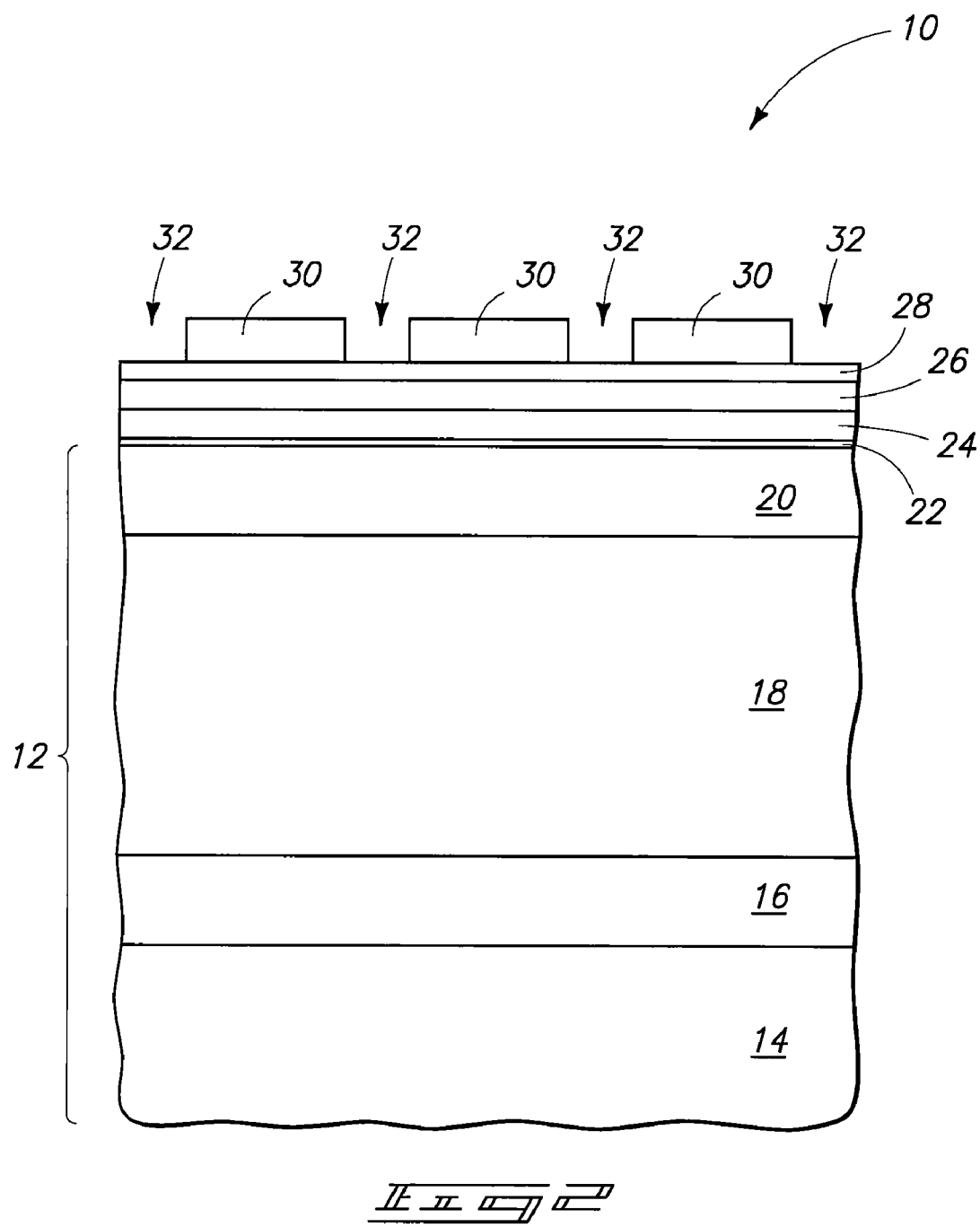
FIG. 2 is a sectional view of the FIG. 1 substrate taken through line 2-2 in FIG. 1.

Referring initially to FIGS. 1 and 2, a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 10 is depicted as comprising a bulk semiconductor substrate, for example comprising monocrystalline silicon 12, although other silicon-comprising substrates such as semiconductor-on-insulator and other substrates might be used. Material 12 may include other materials, for example germanium and/or conductivity modifying dopants. In one embodiment, bulk silicon material 12 comprises a p-type bulk region 14 that is doped to any suitable p− level doping. Thereabove are sequentially depicted an n-type doped n+ region 16, an n-type n− doped region 18, and a p-type p+ doped region 20. Alternate silicon-containing substrates are also of course contemplated.

A series of masking layers is received above silicon material 20. Such includes a pad oxide layer 22, a silicon nitride or polysilicon layer 24, a hardmasking layer 26, an antireflective coating layer 28, and a patterned photoresist layer 30. Any of such layers are optional, and may comprise multiple different materials and/or layers with respect to each. Such materials may or may not be ultimately sacrificial. In certain embodiments, hardmask layer 26 may be any of insulative, semiconductive, or conductive. Example insulative materials for hardmask layer 26 include silicon dioxide, whether doped or undoped, as well as silicon nitride. Example conductive materials for hardmask layer 26 include any one or combination of refractory metal nitrides (i.e., TiN, WN, etc.), refractory metal silicides ($WSi_x$, $TiS_x$, etc.), or any metal in elemental form (Ti, W, etc.). Photoresist 30 is depicted as having been patterned to form trenches 32 to antireflective coating layer 28.

Figure 3:
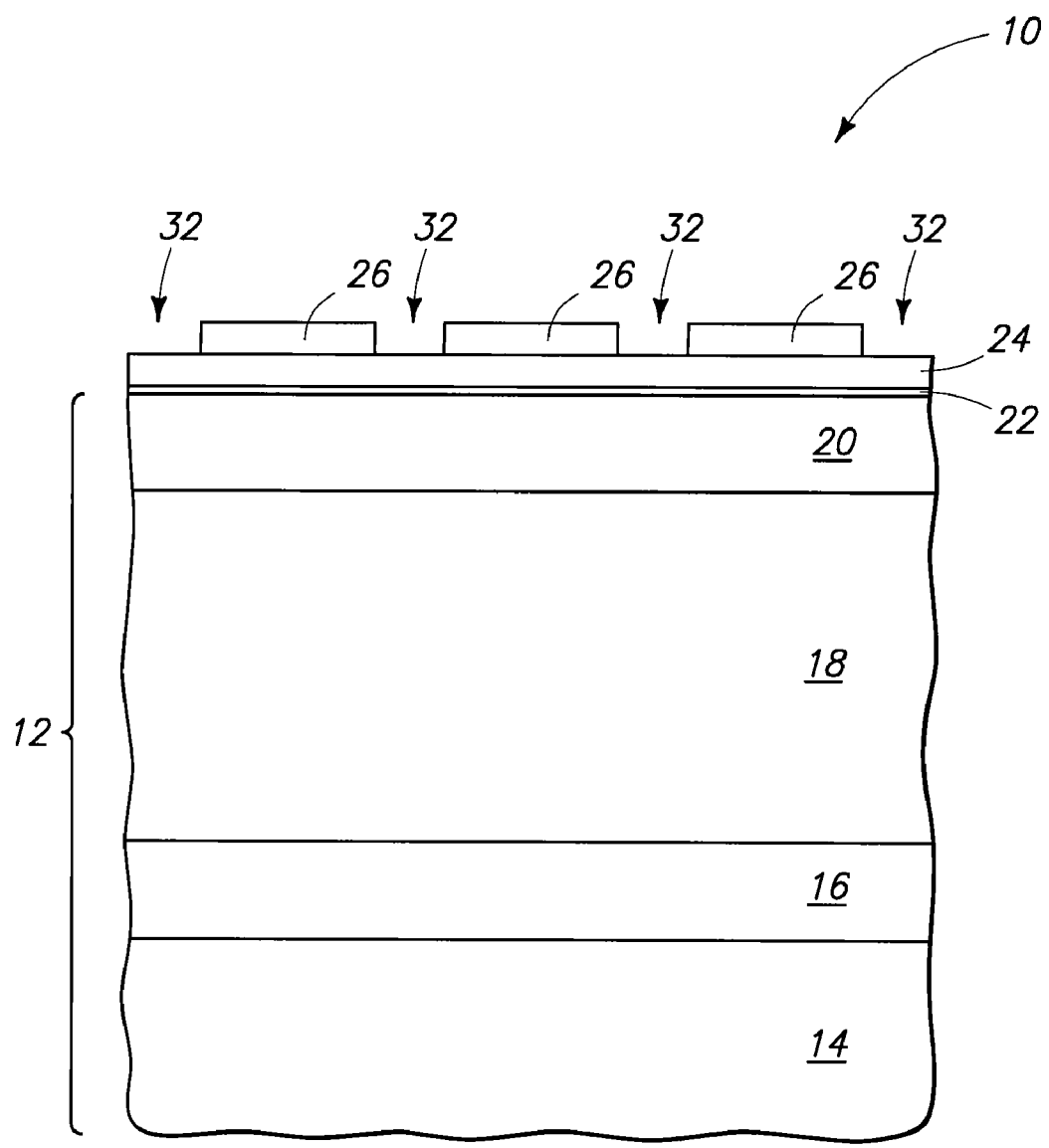
FIG. 3 is a view of the FIG. 2 substrate at a processing subsequent to that shown by FIG. 2.

Referring to FIG. 3, photoresist 30 (not shown) and antireflective coating layer 28 (not shown) have been used as a mask to etch through hardmask layer 26, with photoresist layer 30 and antireflective coating 28 being removed at least in part by such etching and/or subsequently. An example anisotropic dry etching chemistry for conducting the same includes $SO_2+O_2$ or $O_2+HBr$, or $O_2+N_2$ for the photoresist, and for the antireflective coating generally one or more fluorocarbons, for example $CF_4$,+HBr+He.

Figure 4:
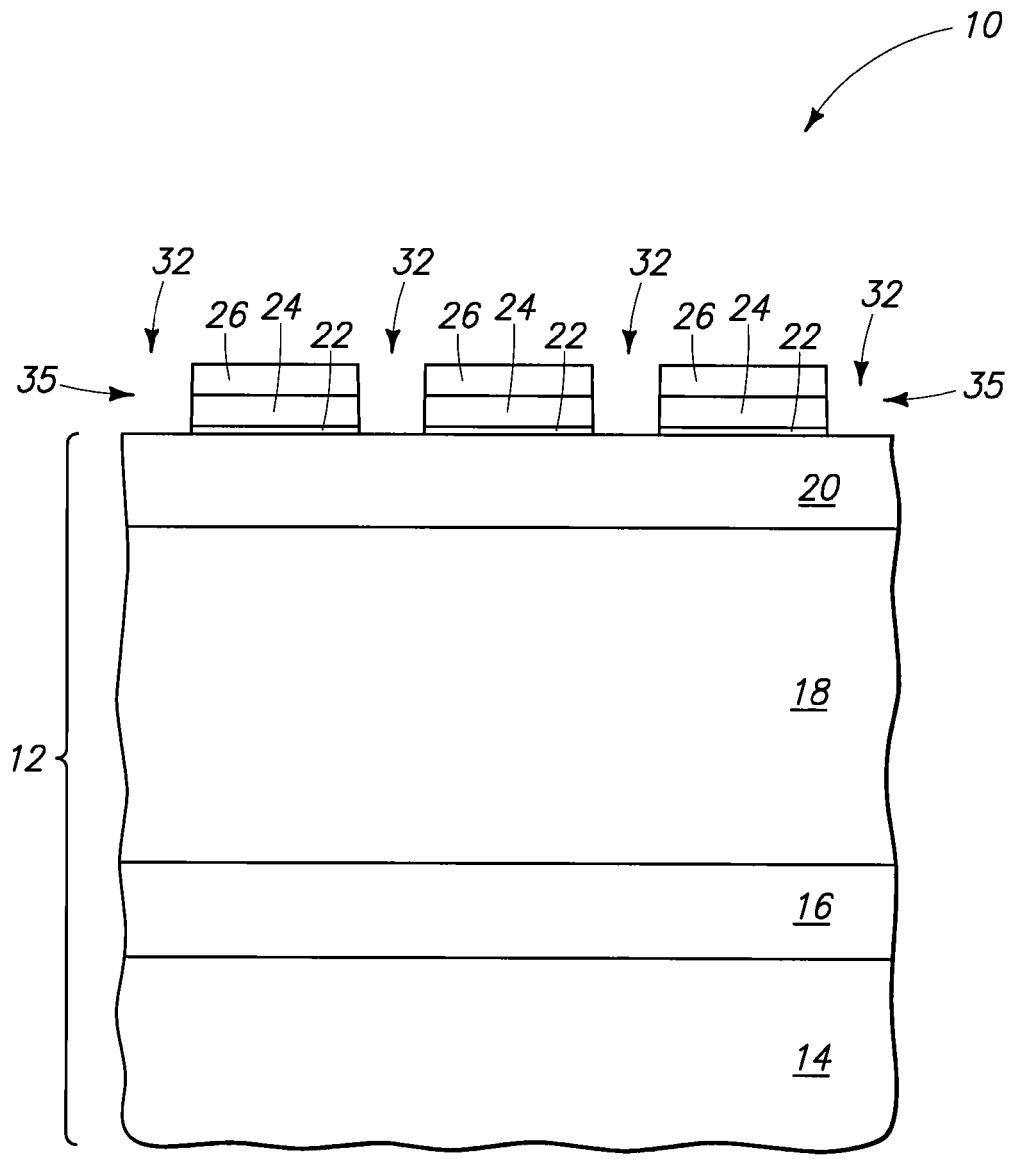
FIG. 4 is a view of the FIG. 3 substrate at a processing subsequent to that shown by FIG. 3.

Referring to FIG. 4, patterned hardmask layer 26 has been used as a mask for etching through layers 24 and 22, thereby extending trenches 32 ultimately to silicon 12. An example etching chemistry for etching through a silicon nitride layer 24 includes one or fluorocarbons+$SF_6$+$NF_3$, while an example etching chemistry for clearing pad oxide 22 thereafter includes one or more fluorocarbons, for example $CF_4$, $CHF_3$, $CH_2F_2$, etc. FIG. 4 thereby depicts, in but one example embodiment, the formation of a mask 35 over silicon of the semiconductor substrate, with mask 35 comprising trenches 32 formed there-through. Such mask may or may not include a hardmask layer, and in but one example can be considered as a first mask comprising first trenches 32 formed there-through which run in a first major direction over substrate 10. The example first major direction in the depiction of FIG. 4 would be perpendicularly into and out of the plane of the page upon which FIG. 4 lies. Of course, first trenches 32 might not be entirely straight in such direction and might, by way of example only, serpentine relative to each other but nevertheless, in one embodiment, run in a first major direction over the substrate as just described.

Figure 5:
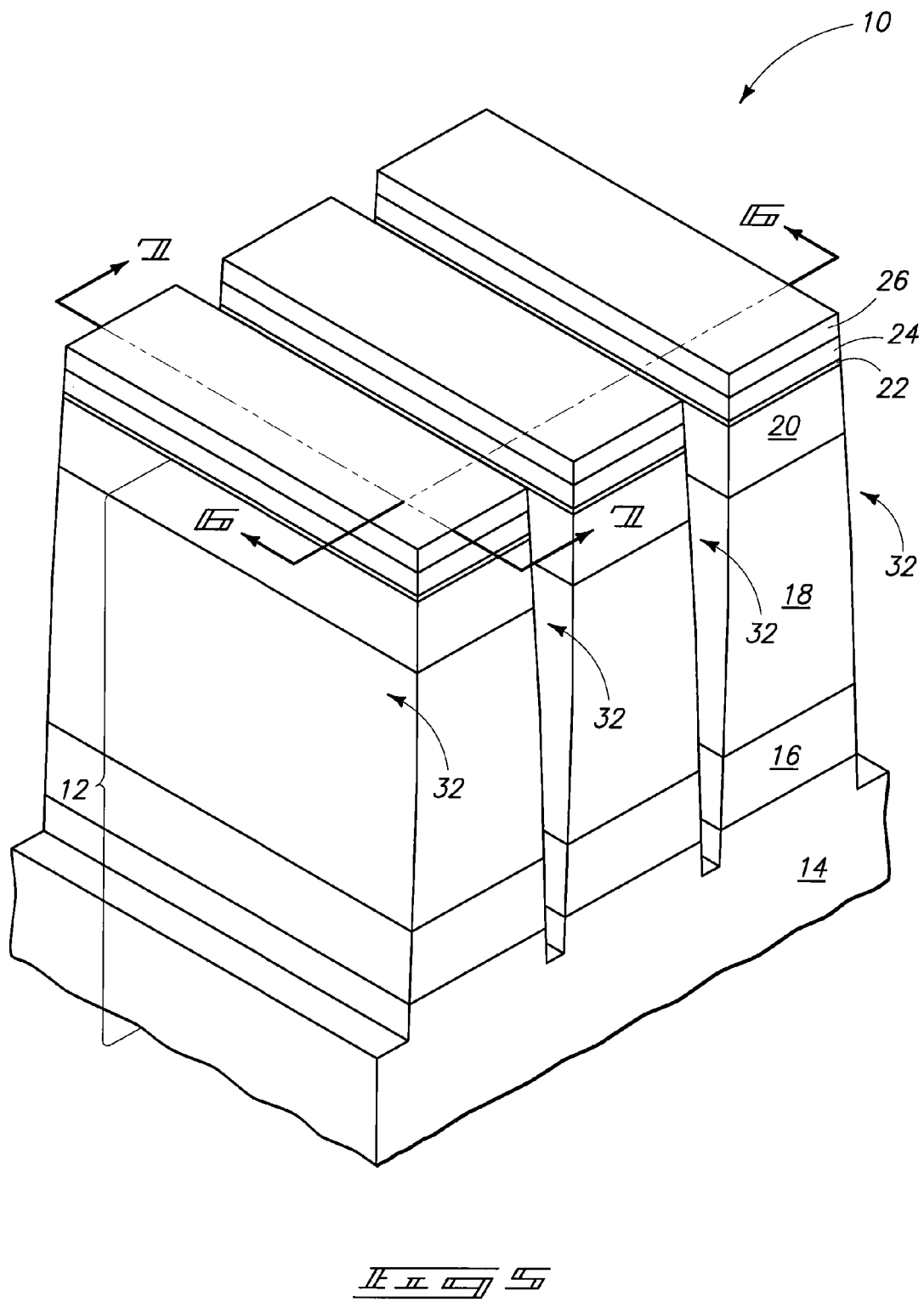
FIG. 5 is a view of the FIG. 1 substrate at a processing subsequent to that shown by FIG. 4.
Figure 6:
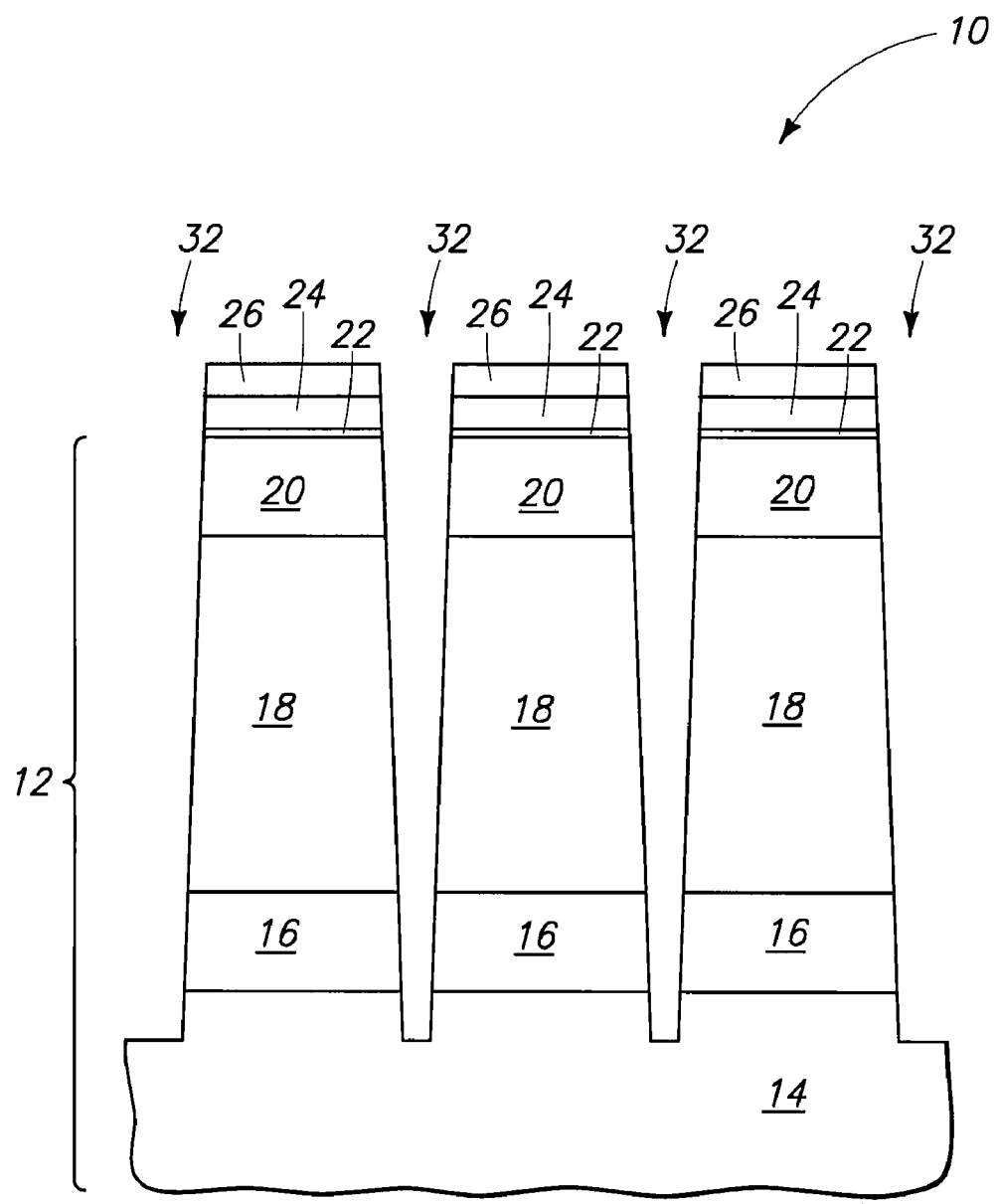
FIG. 6 is a sectional view of the FIG. 5 substrate taken through line 5-5 in FIG. 5.
Figure 7:
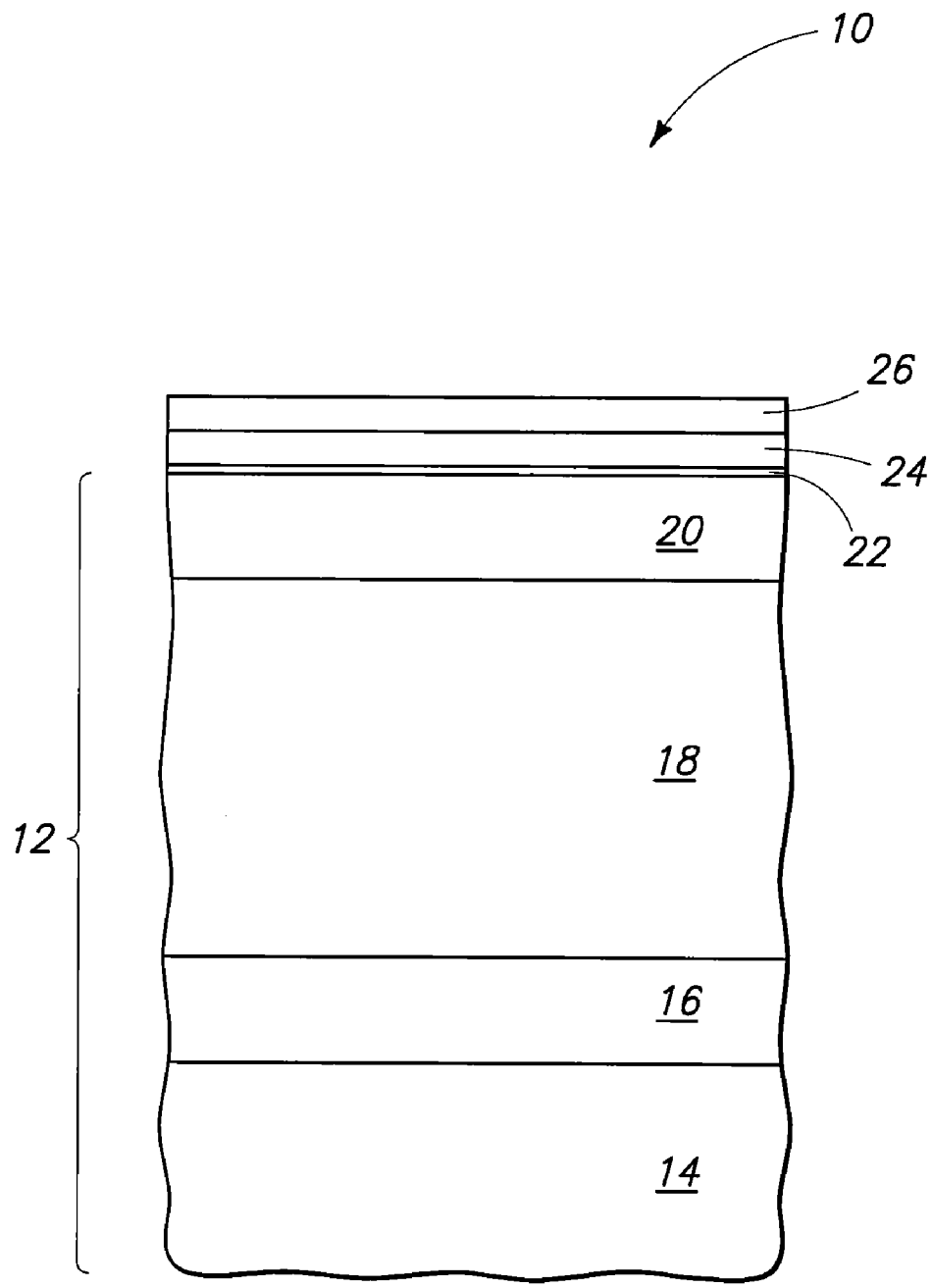
FIG. 7 is a sectional view of the FIG. 5 substrate taken through line 7-7 in FIG. 5.

Referring to FIGS. 5, 6, and 7, trenches 32 have been extended relative to substrate 10 by plasma etching into silicon 12 thereof using mask 35. In one embodiment, the plasma etching comprises forming an etching plasma using precursor gases comprising $SF_6$, an oxygen-containing compound, and a nitrogen-containing compound. The oxygen-containing compound and the nitrogen-containing compound might comprise different compounds, and/or might comprise the same compound. For example in one embodiment, the oxygen-containing compound comprises $O_2$, and the nitrogen-containing compound comprises $N_2$. An example oxygen-containing compound and nitrogen-containing compound encompassed by the same compound includes $NO_x$, where "x" ranges from, for example, about 1 to 3.

Further of course, the precursor gases might comprise two oxygen-containing compounds, for example with one of the oxygen-containing compounds being void of nitrogen and another of the oxygen-containing compounds comprising nitrogen. For example in but one embodiment, the precursor gases might comprise $SF_6$, $N_2$, $O_2$, and $NO_x$. Alternately in such example, the precursor gases from which the plasma etching occurs might not include $N_2$. Further in one embodiment, the precursor gases might comprise, consist essentially of, or consist of $SF_6$, $O_2$, and $N_2$. Additional precursor gases might also of course be utilized, for example HBr. In one embodiment, the precursor gases from which the plasma etching is conducted might comprise more $N_2$ than each of $SF_6$ and $O_2$ where such three gases are used. In one embodiment, the mask used during the etch comprises an outermost hardmask layer during at least a latter portion of the plasma etching into the silicon, and in one embodiment such outer mask layer is void of carbon as the stated plasma etching chemistry may etch an outermost hardmask layer that comprises carbon.

The invention was reduced to practice using a LAM Kiyo plasma etching chamber. Regardless and by way of examples only, example pressure during etching may be from about 1 mTorr to about 50 mTorr, and an example temperature range for the susceptor upon which the substrate rests is from about 0° C. to about 50° C. An example source power range is from about 100 W to about 1,000 W, and an example bias voltage is from about −20V to about −1,000V. Where, for example $SF_6$, $O_2$, $N_2$, and HBr are precursor gases, example flow rates include from about 1 sccm to about 100 sccm for $SF_6$; from about 10 sccm to about 500 sccm for $O_2$; from 0 sccm to about 500 sccm for HBr; and from about 1 sccm to about 500 sccm for $N_2$. A specific reduction-to-practice example in the LAM Kiyo plasma etching chamber included 5 mTorr, 7° C., −500V voltage bias, 400 W source power, 350 sccm $SF_6$, 45 sccm $O_2$, 60 sccm $N_2$, and 20 sccm HBr. The particular plasma etcher used might be capable of operation such that either the bias voltage or the bias power can be the set point while the other is allowed to float. In one embodiment, bias voltage is set and bias power is allowed to float. In another embodiment, bias power is set and bias voltage is allowed to float.

It was determined that etching with $SF_6$ and $O_2$ without any nitrogen-containing compound may result in significant trench sidewall erosion, irregular trench sidewalls, and/or v-shaped trench bases. However, it was discovered that by adding a nitrogen-containing compound to the plasma etching chemistry, smoother and/or straighter trench sidewall resulted and with flatter trench bases, although the invention does not necessarily require achieving any of such results unless literally so claimed. Further, and without necessarily being limited by any theory of invention, presence of nitrogen in the plasma may be creating an $NF_x$ species that may or may not be facilitating straighter sidewalls and flatter bases.

Regardless, one embodiment of the invention includes plasma etching trenches into silicon of a semiconductor substrate using a mask having trenches formed there-through, wherein the plasma etching comprises an etching plasma comprising a sulfur-containing component, an oxygen-containing component, and $NF_x$. In one embodiment, the sulfur-containing component is formed from a precursor gas comprising $SF_6$. In one embodiment, the oxygen of the oxygen-containing component may be formed from a precursor gas comprising $O_2$, and the nitrogen of the $NF_x$ may be formed from a precursor gas compound which is void of oxygen. Further in one embodiment, the oxygen of the oxygen-containing component and the nitrogen of the $NF_x$ may be formed from a precursor gas comprising $NO_x$. Further, example precursor gases include any of those described above, including any combinations thereof.

Example etch depths for trenches 32 within silicon 12 are from about 7,500 Angstroms to about 20,000 Angstroms, with 9,000 Angstroms being but one specific example.

Figure 8:
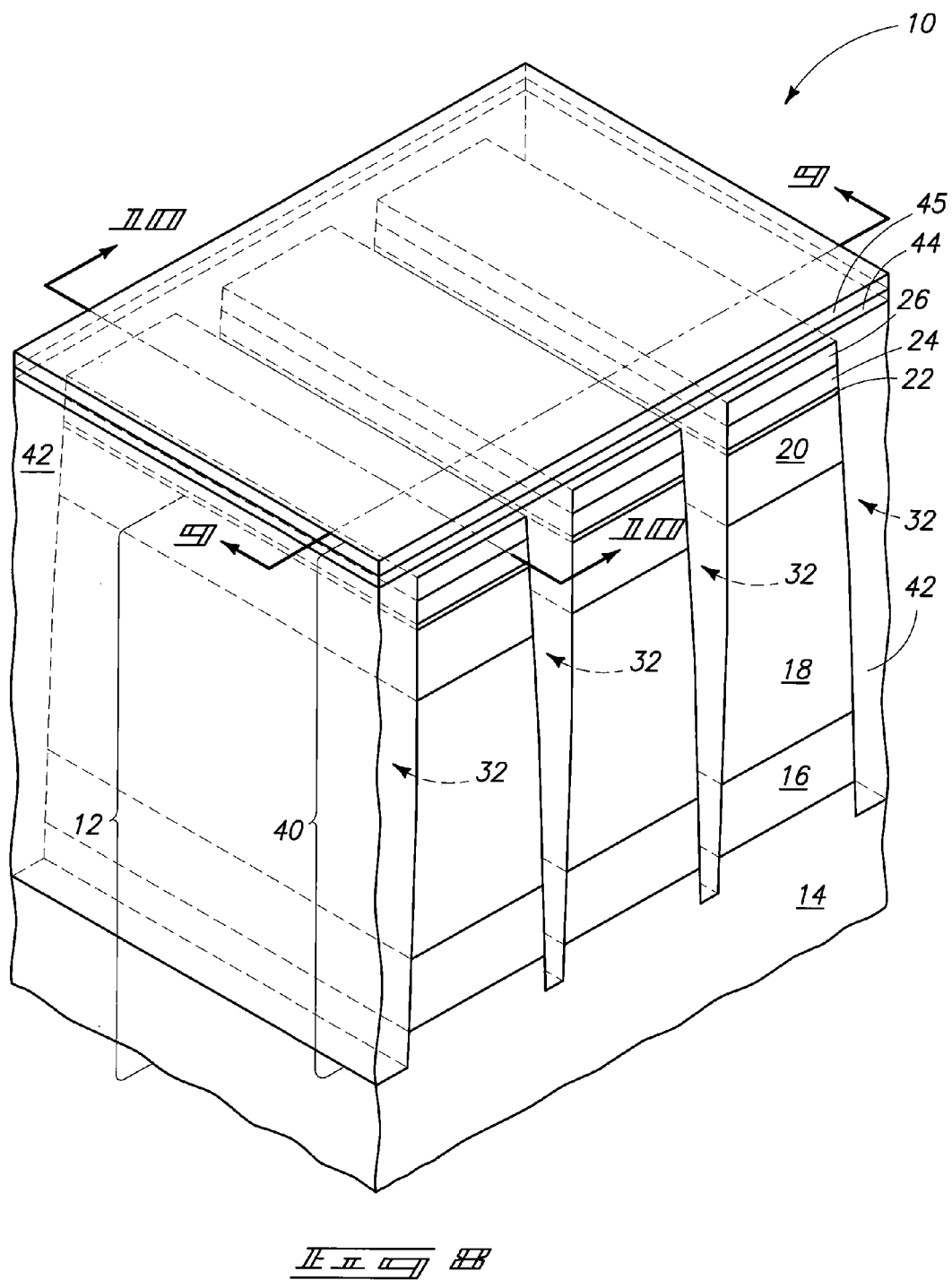
FIG. 8 is a view of the FIG. 5 substrate at a processing subsequent to that shown by FIG. 5.
Figure 9:
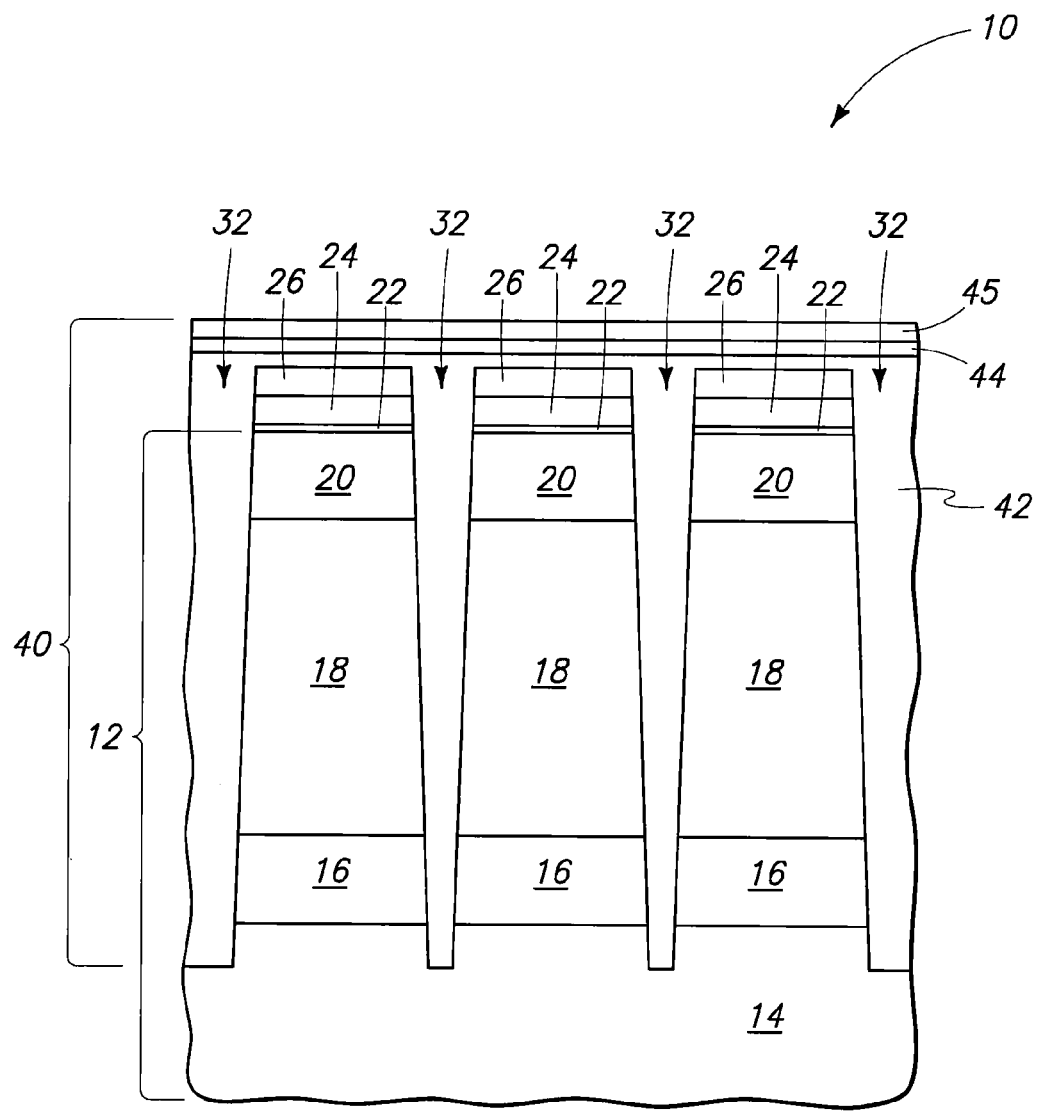
FIG. 9 is a sectional view of the FIG. 8 substrate taken through line 9-9 in FIG. 8.
Figure 10:
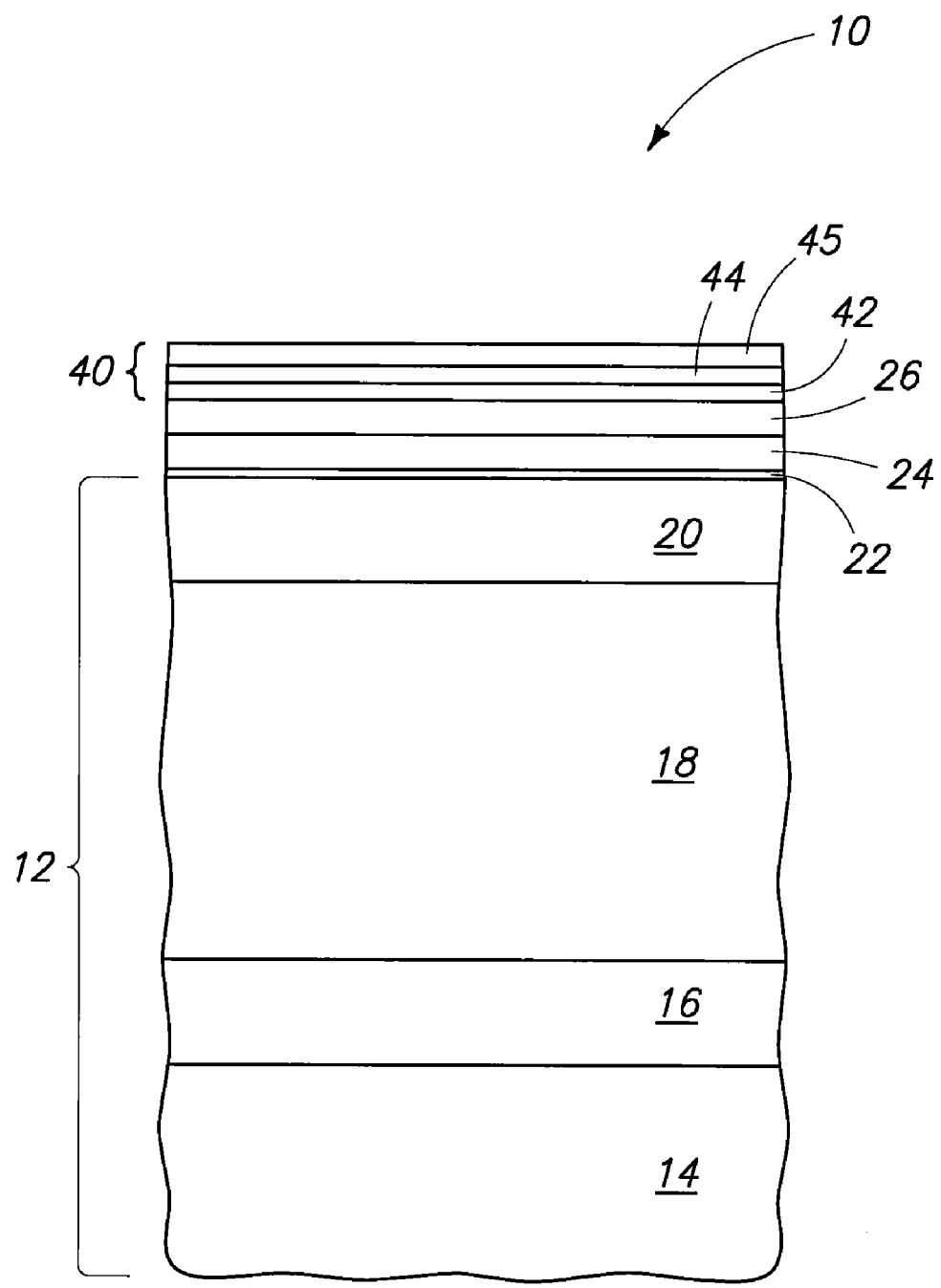
FIG. 10 is a sectional view of the FIG. 5 substrate taken through line 10-10 in FIG. 8.

Referring to FIGS. 8, 9, and 10, masking layers 40 have been formed over substrate 10 and accordingly over first trenches 32 within silicon of the substrate. In one embodiment, masking layers 40 comprise multi-layer resist, with three such example layers being sequentially shown as comprising a first layer 42, a layer 44 thereover, and another layer 45. In one example, layer 42 is in the form of a liquid resin which deposits to completely fill first trenches 32 and be received over hardmask layer 26 of first mask 35, and thereafter is solidified. An example layer 44 is any silicon-containing hardmask, with an example layer 45 thereover comprising a photoimageable material such as photoresist.

Figure 11:
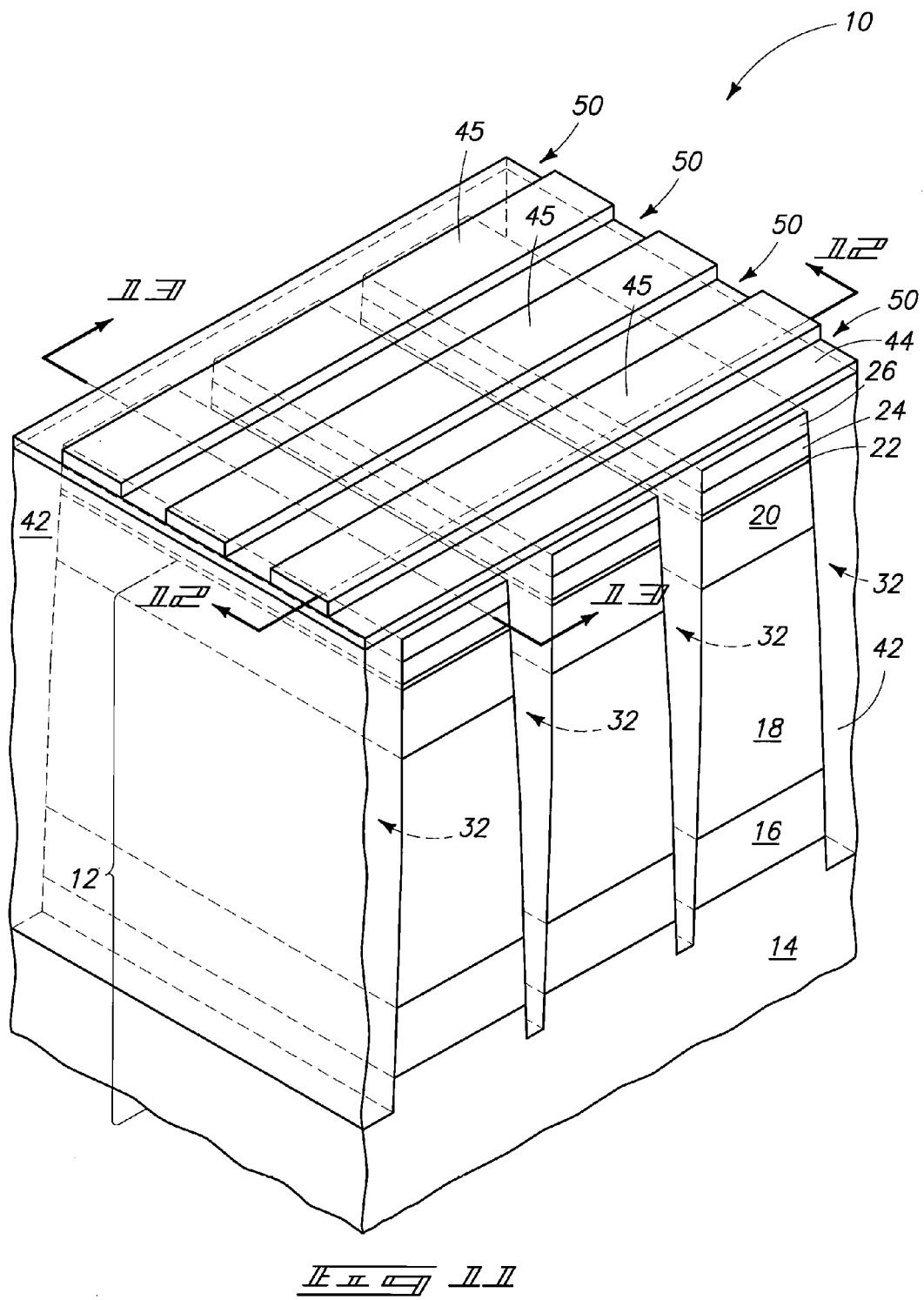
FIG. 11 is a view of the FIG. 8 substrate at a processing subsequent to that shown by FIG. 8.
Figure 12:
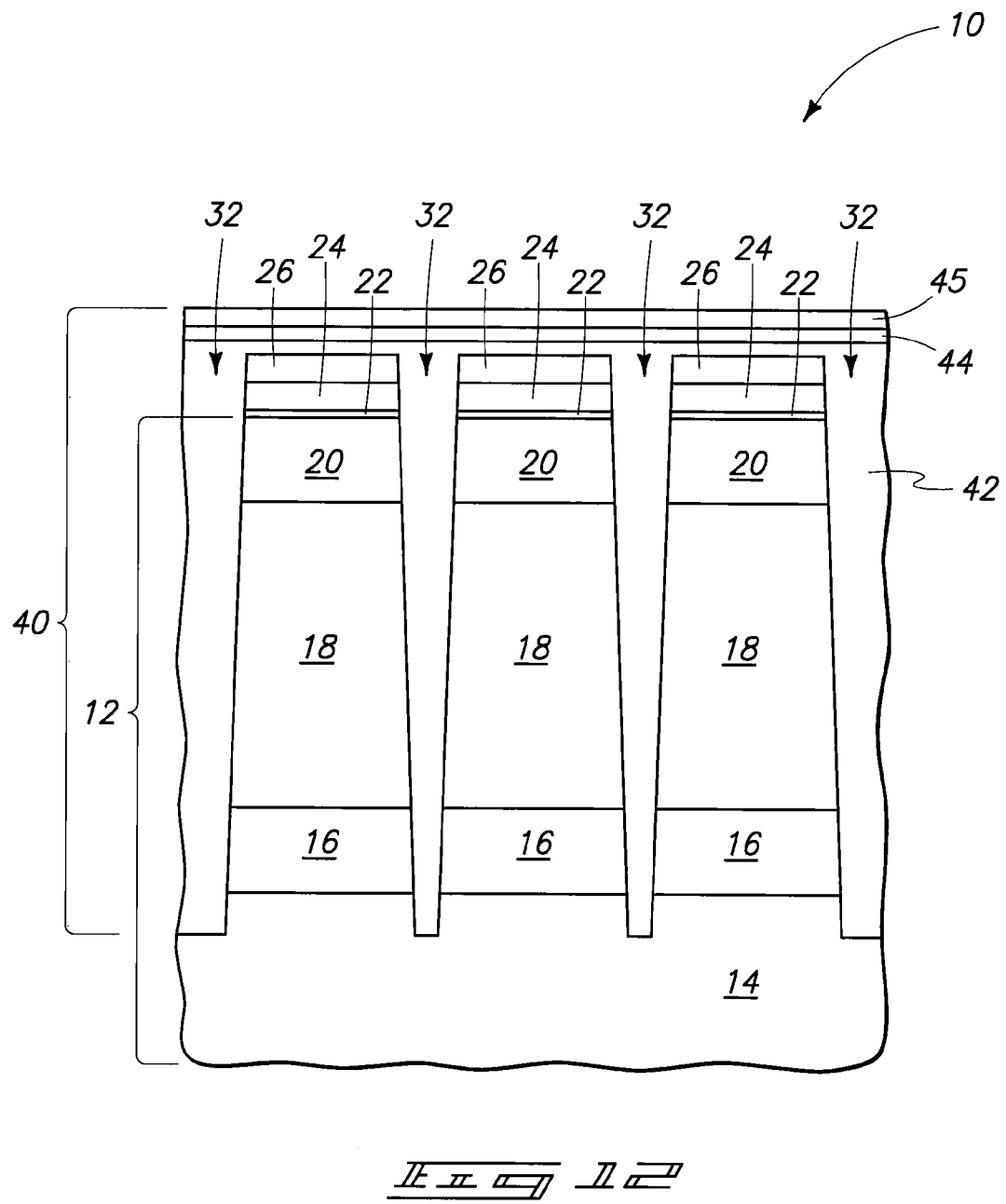
FIG. 12 is a sectional view of the FIG. 11 substrate taken through line 12-12 in FIG. 11.
Figure 13:
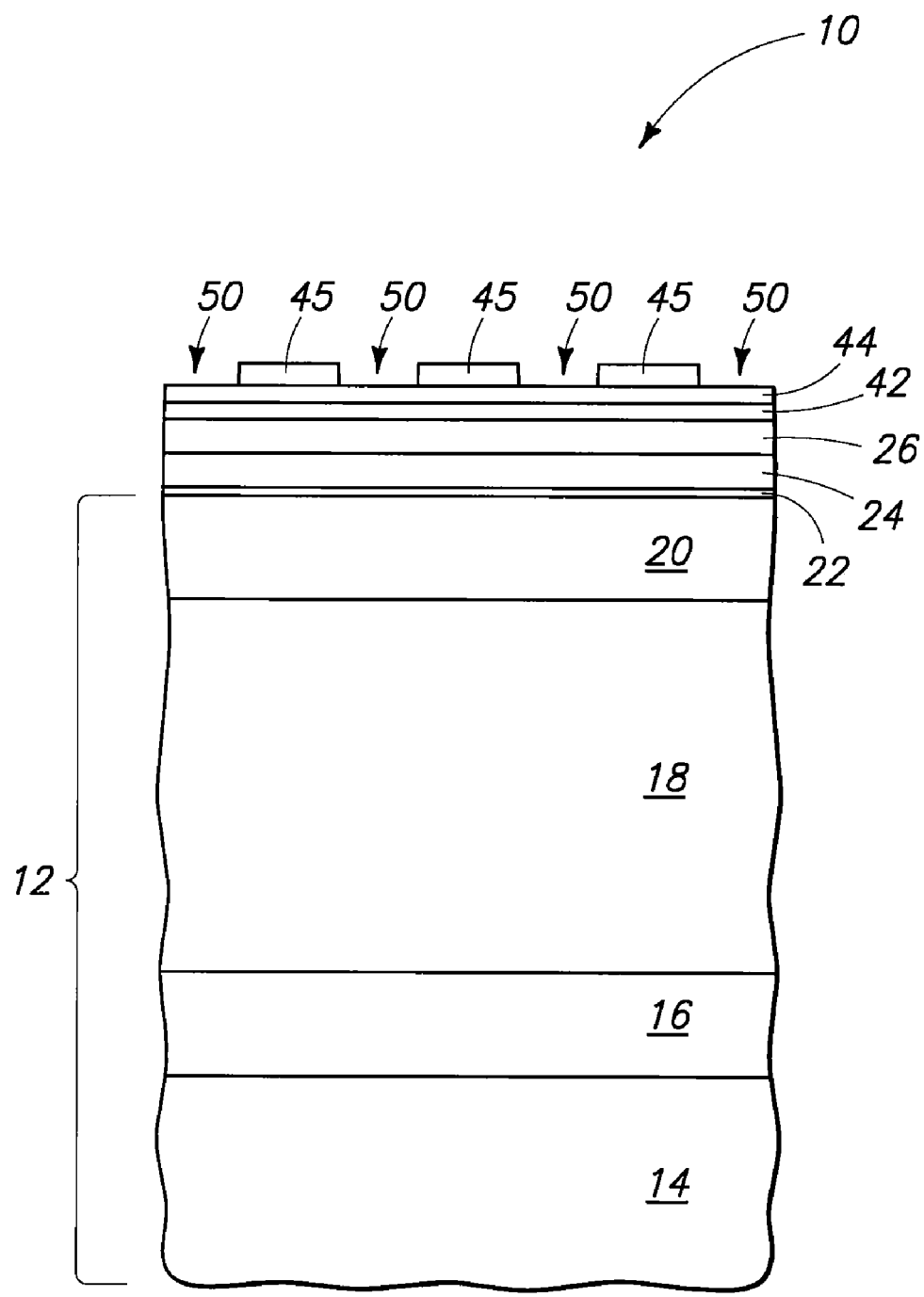
FIG. 13 is a sectional view of the FIG. 11 substrate taken through line 13-13 in FIG. 11.

Referring to FIGS. 11, 12, and 13, photoimageable layer 45 has been patterned to form second trenches 50 which run in a second major direction over substrate 10 which is orthogonal to the first major direction. The example second major direction in FIG. 13 would be perpendicularly into and out of the plane of the page upon which FIG. 13 lies, and in the direction which arrows 13 point in FIG. 11. Further, the first major direction as described above would be in the direction which arrows 12 point in FIG. 11. Of course, second trenches 50 might not be entirely straight in such second major direction and might, by way of example only, serpentine relative to each other but nevertheless, in one embodiment, run in a second major direction over the substrate as just described.

Figure 14:
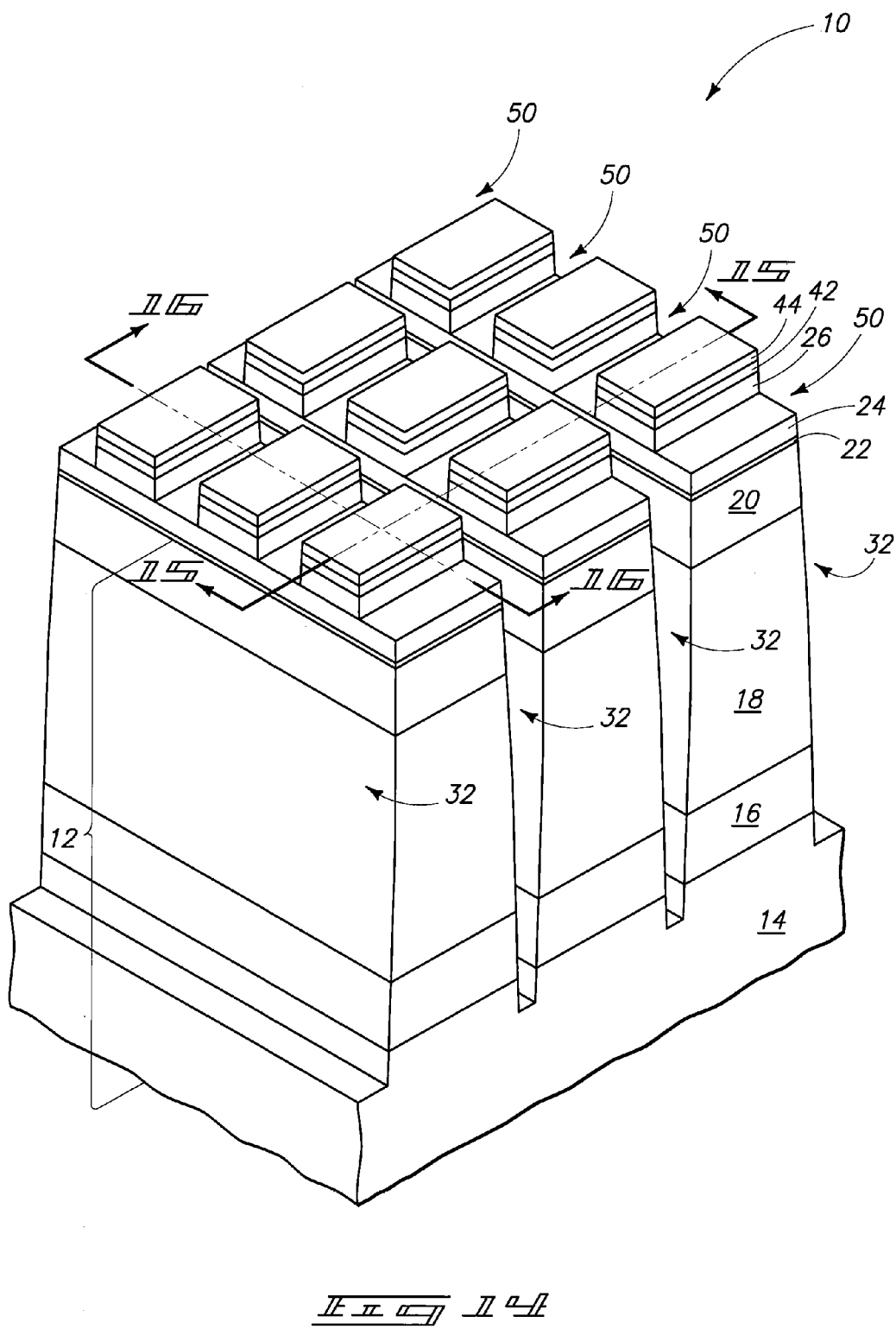
FIG. 14 is a view of the FIG. 11 substrate at a processing subsequent to that shown by FIG. 11.
Figure 15:
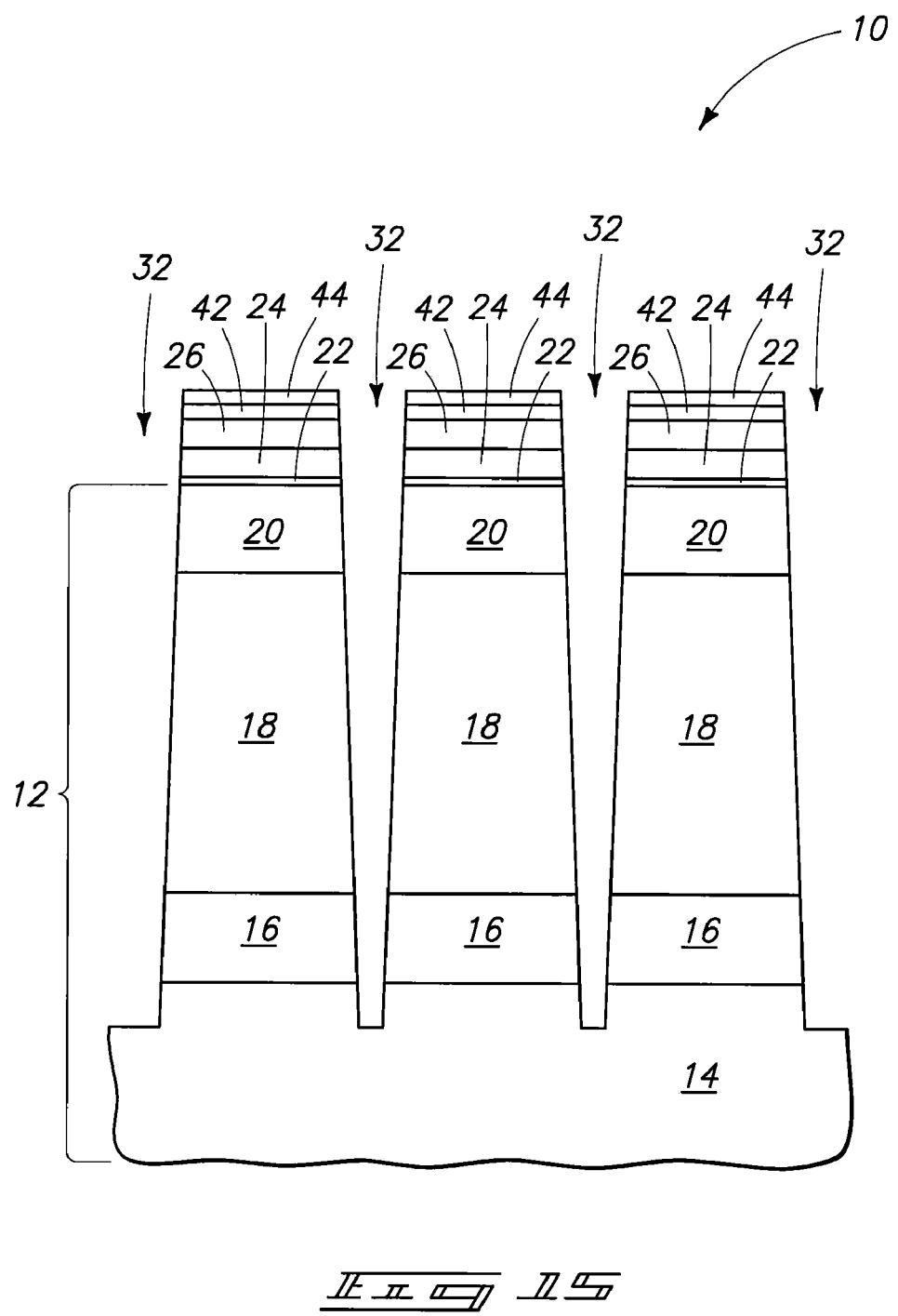
FIG. 15 is a sectional view of the FIG. 14 substrate taken through line 15-15 in FIG. 14.
Figure 16:
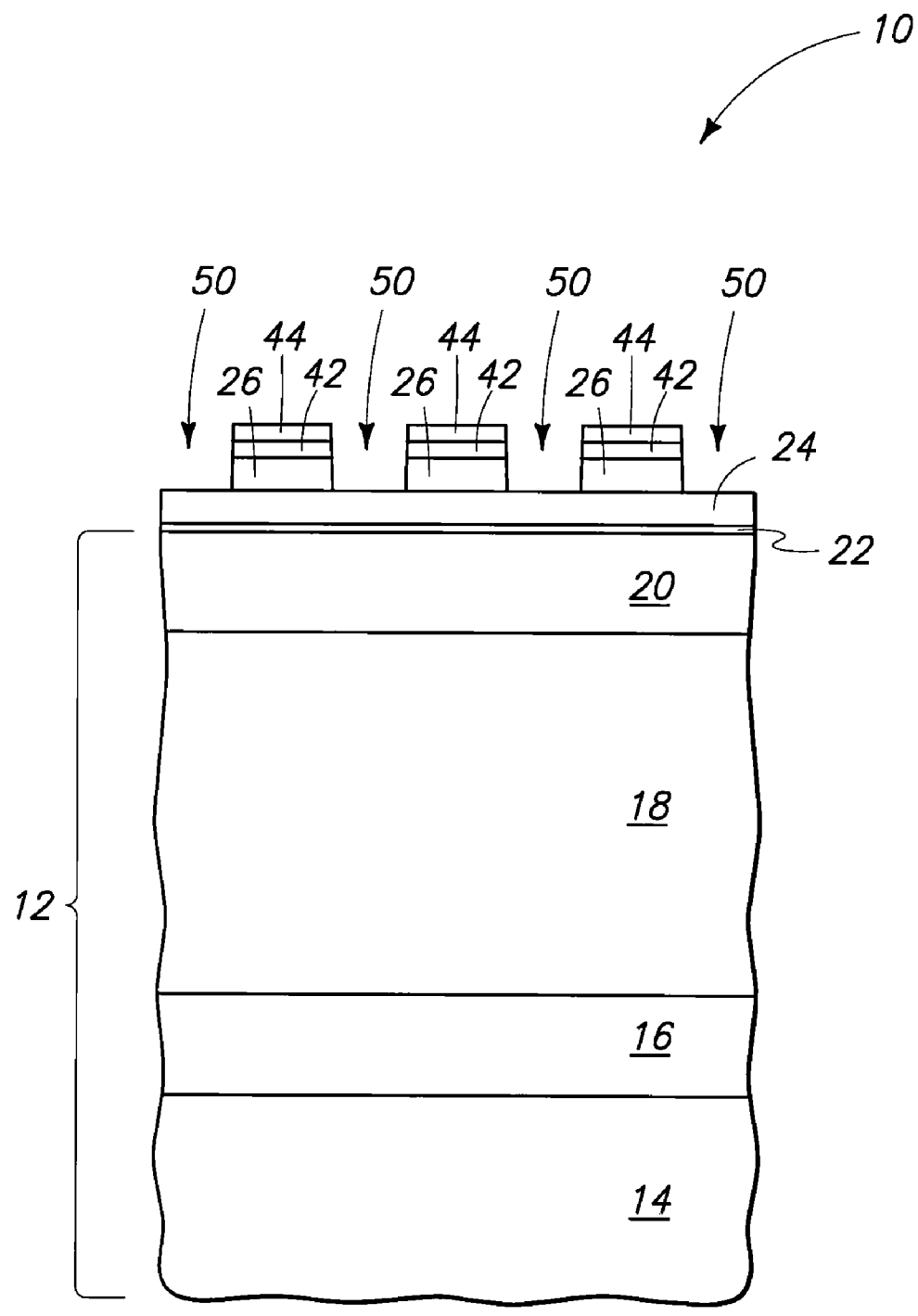
FIG. 16 is a sectional view of the FIG. 14 substrate taken through line 16-16 in FIG. 14.

Referring to FIGS. 14, 15, and 16, patterned photoimageable material 45 (not shown) has been used as a mask to etch silicon-containing hardmask layer 44, resin 42, and hardmask layer 26 of first mask 35 to extend second trenches 50 through hardmask layer 26 to silicon nitride layer 24, with photoimageable material 45 being removed during such etching and/or subsequently.

Figure 17:
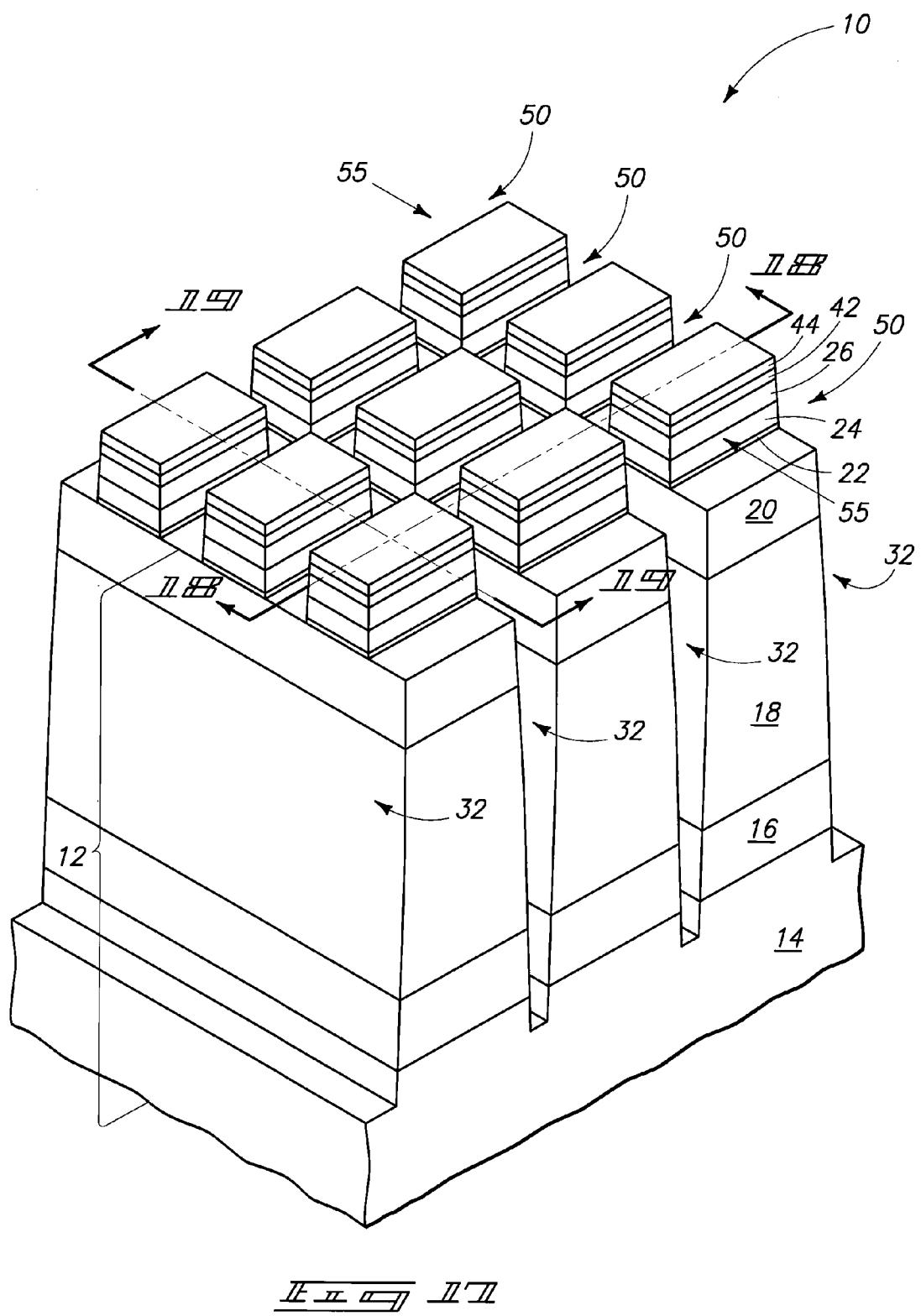
FIG. 17 is a view of the FIG. 14 substrate at a processing subsequent to that shown by FIG. 14.
Figure 18:
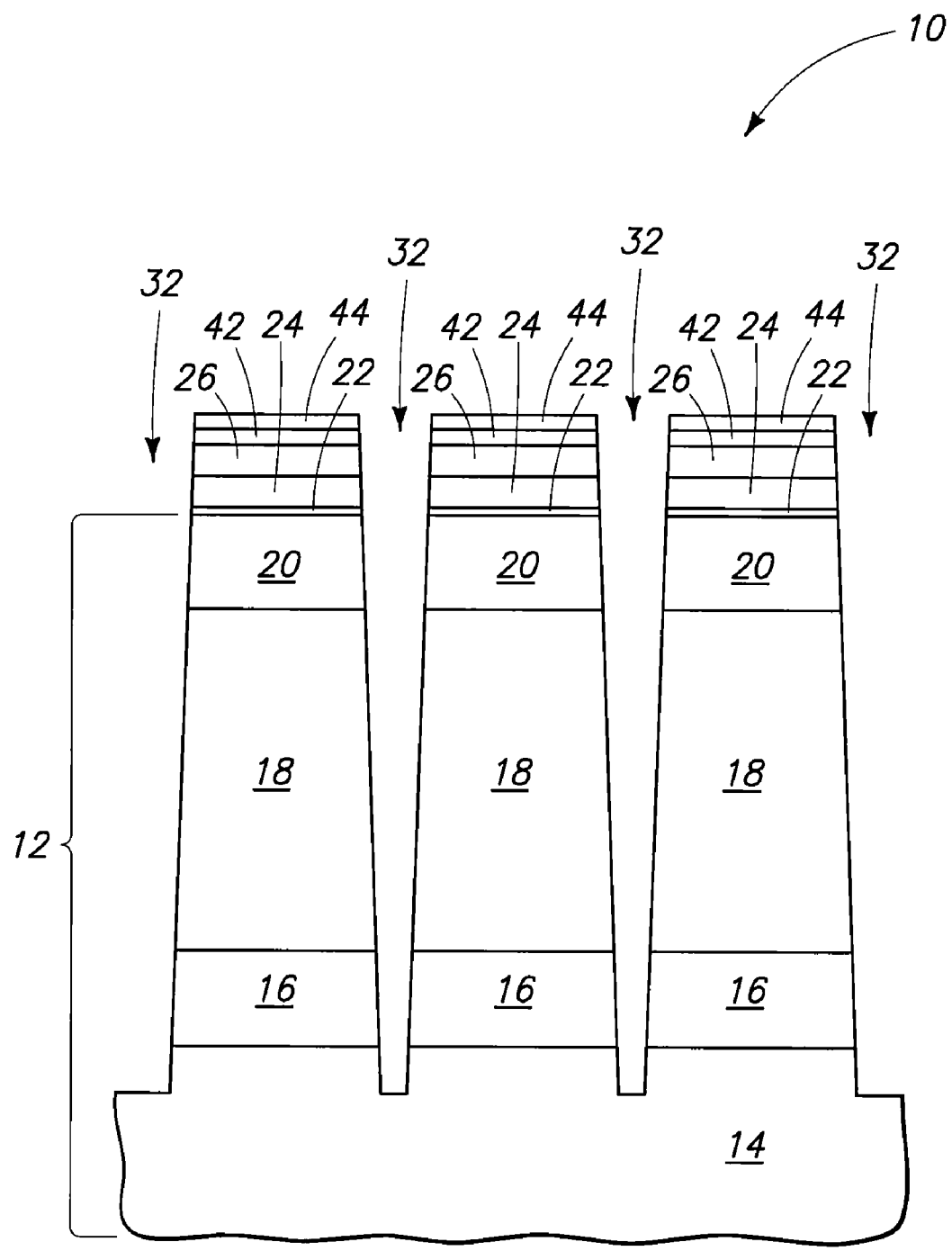
FIG. 18 is a sectional view of the FIG. 17 substrate taken through line 18-18 in FIG. 17.
Figure 19:
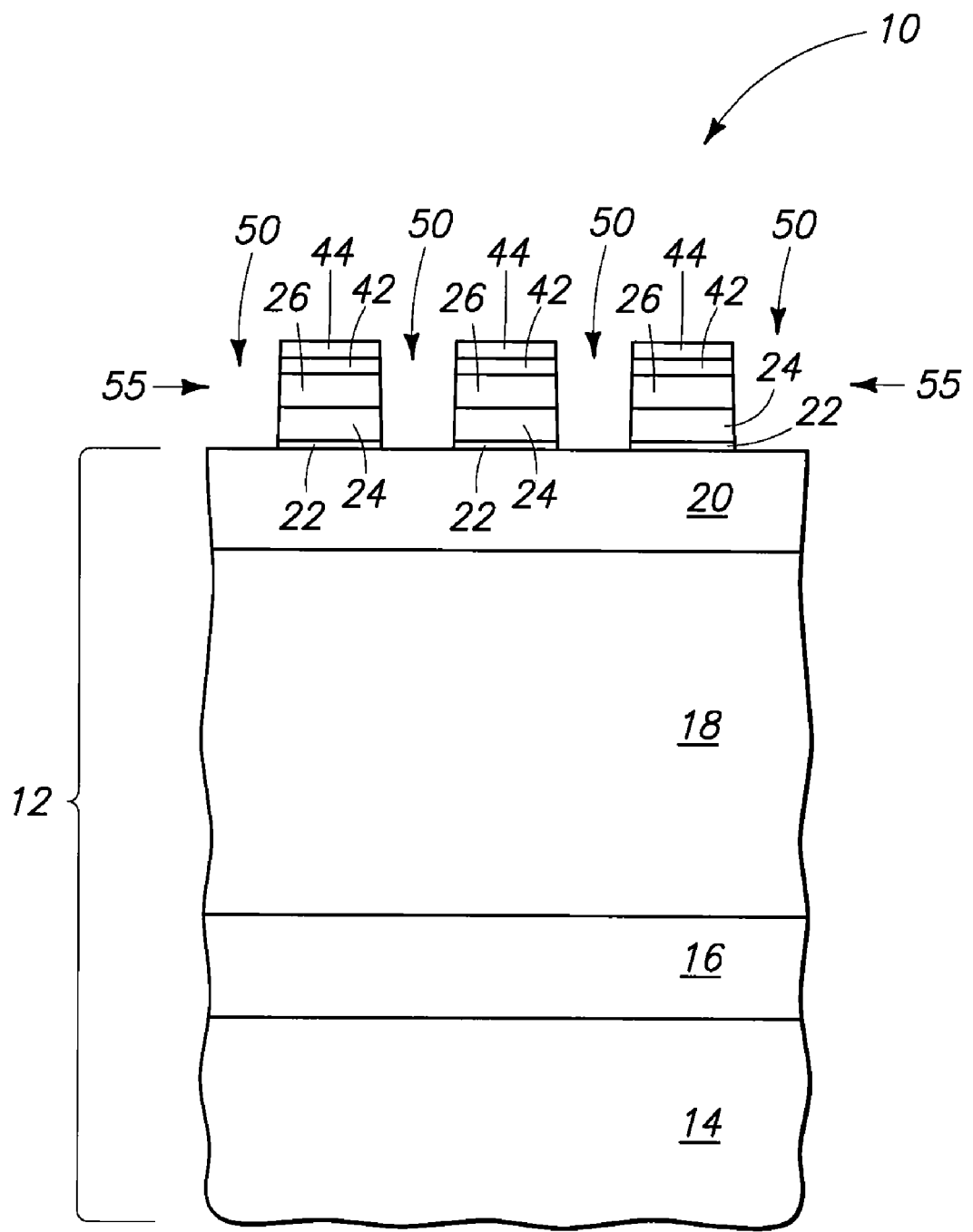
FIG. 19 is a sectional view of the FIG. 17 substrate taken through line 19-19 in FIG. 17.

Referring to FIGS. 17, 18, and 19, etching has been conducted to extend trenches 50 through silicon nitride layer 24 and pad oxide layer 22 to silicon material 12. Accordingly, and in but one embodiment, second trenches 50 extend through hardmask layer 26 of first mask 35 and a second mask 55 is formed over the first trenches and comprises hardmask layer 26 of the first mask.

Figure 20:
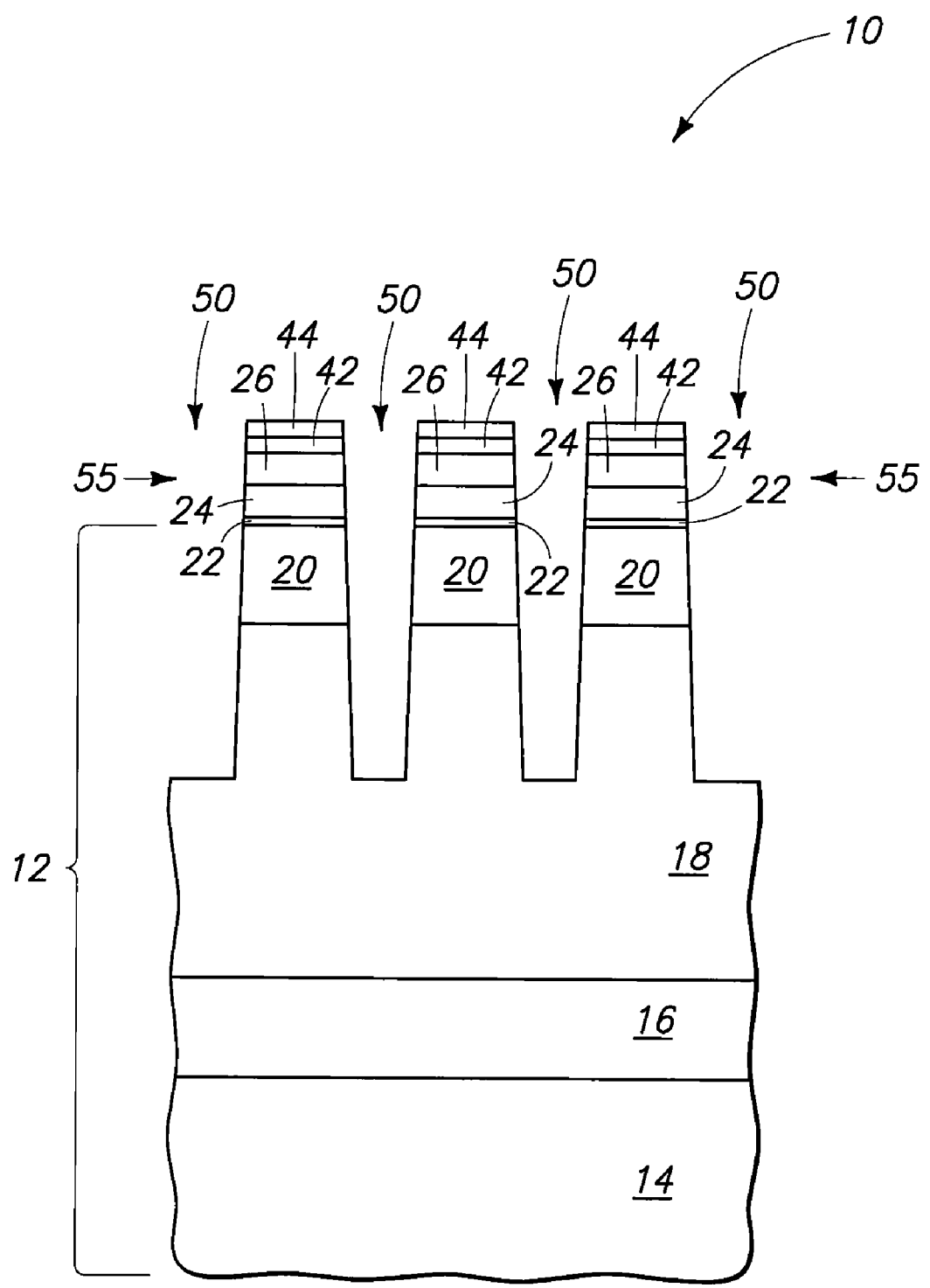
FIG. 20 is a view of the FIG. 19 substrate at a processing subsequent to that shown by FIG. 19.

Referring to FIG. 20, second trenches 50 have been extended into silicon 12 by plasma etching thereof using second mask 55. Some of material 42 (not shown or viewable in FIG. 20) may remain from the processing depicted by FIGS. 14, 15, and 16 (not shown), or another material provided, at the bases of first trenches 32 (not shown or viewable in FIG. 20) to preclude portions of such first trenches to be etched deeper while etching second trenches 50. In one embodiment, the plasma etching of the second trenches into the silicon comprises forming an etching plasma using precursor gases comprising $SF_6$, an oxygen-containing compound, and a nitrogen-containing compound. Any of the above-described processing might be utilized. Further, the plasma etching to form the second trenches within the silicon might be the same as or different from the plasma etching to form the first trenches within the silicon material. Further and regardless, the plasma etching to form the second trenches might comprise an etching plasma comprising a sulfur-containing component, an oxygen-containing component, and $NF_x$, for example as also described above. Regardless and by way of example only, example depths of trenches 50 within silicon material 12 are from about 2,500 Angstroms to about 3,500 Angstroms, with about 3,000 Angstroms being a specific example.

Figure 21:
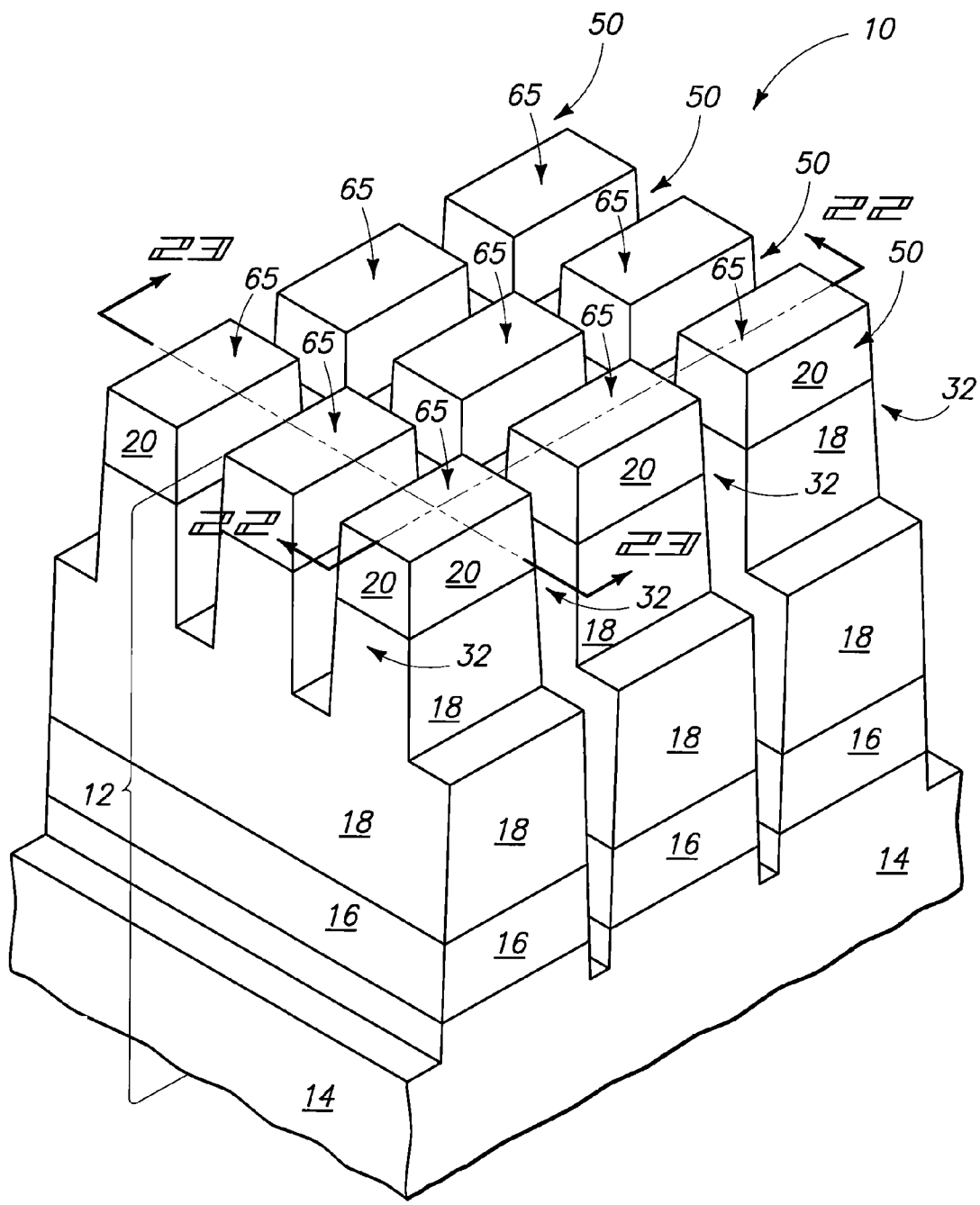
FIG. 21 is a view of the FIG. 17 substrate at a processing subsequent to that shown by FIG. 20.
Figure 22:
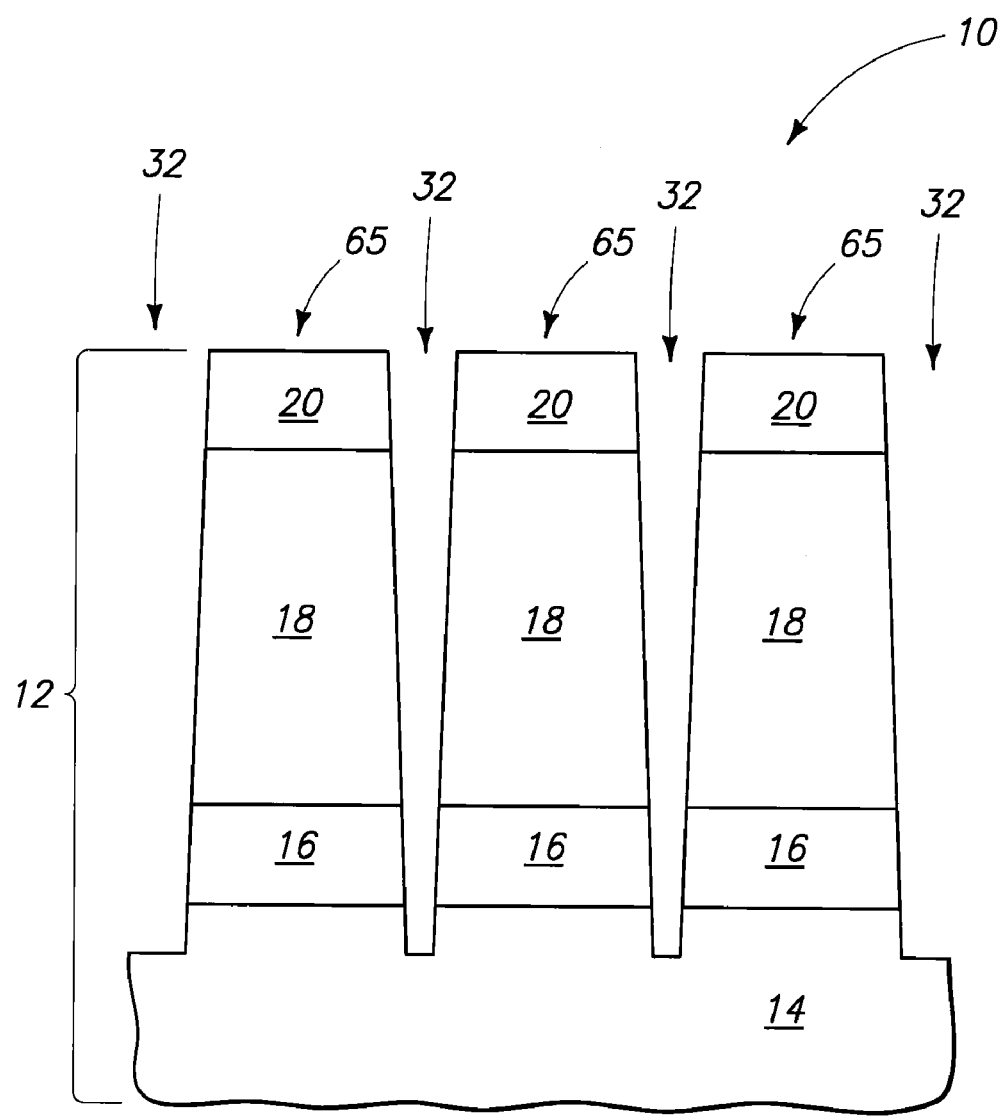
FIG. 22 is a sectional view of the FIG. 21 substrate taken through line 22-22 in FIG. 21.
Figure 23:
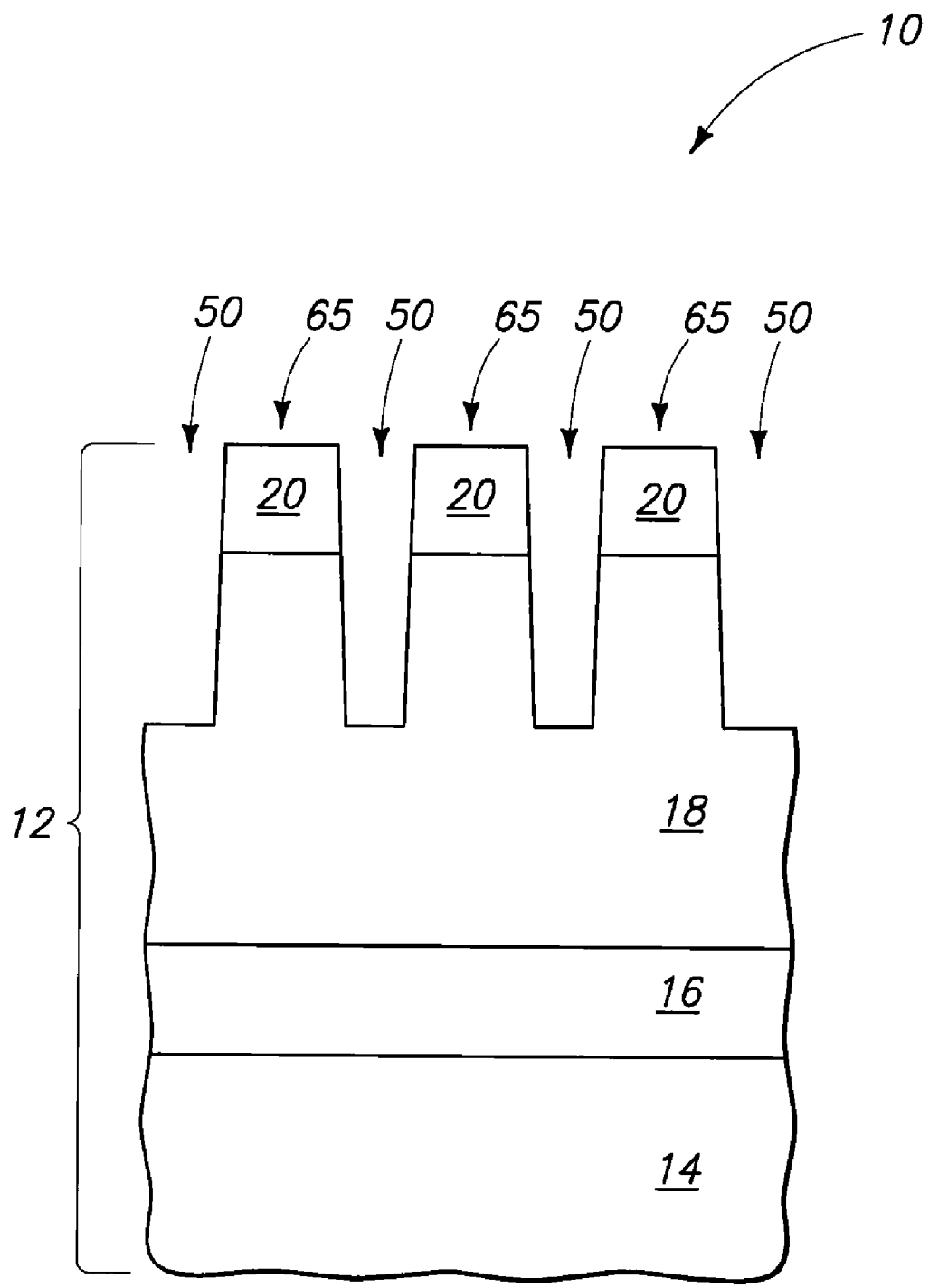
FIG. 23 is a sectional view of the FIG. 21 substrate taken through line 23-23 in FIG. 21.

Some or all of such materials 22, 24, 26, 42, and 44 may or may not be ultimately removed from the substrate. FIGS. 21, 22, and 23, by way of example only, depict all of such materials having been removed and, regardless, the plasma etching of the second trenches resulting in the formation of spaced silicon-comprising mesas 65.

Embodiments of the invention include methods of forming trench isolation within silicon of a semiconductor substrate, and may or may not comprise formation of spaced silicon-comprising mesas. For example and by way of example only, the above-described processing after FIGS. 5-7, or otherwise, might include depositing insulative trench isolation material to within such trenches without necessarily forming the above example second trenches. Further and regardless of forming mesas, insulative trench isolation material might be deposited to within first and second trenches formed within silicon.

Figure 24:
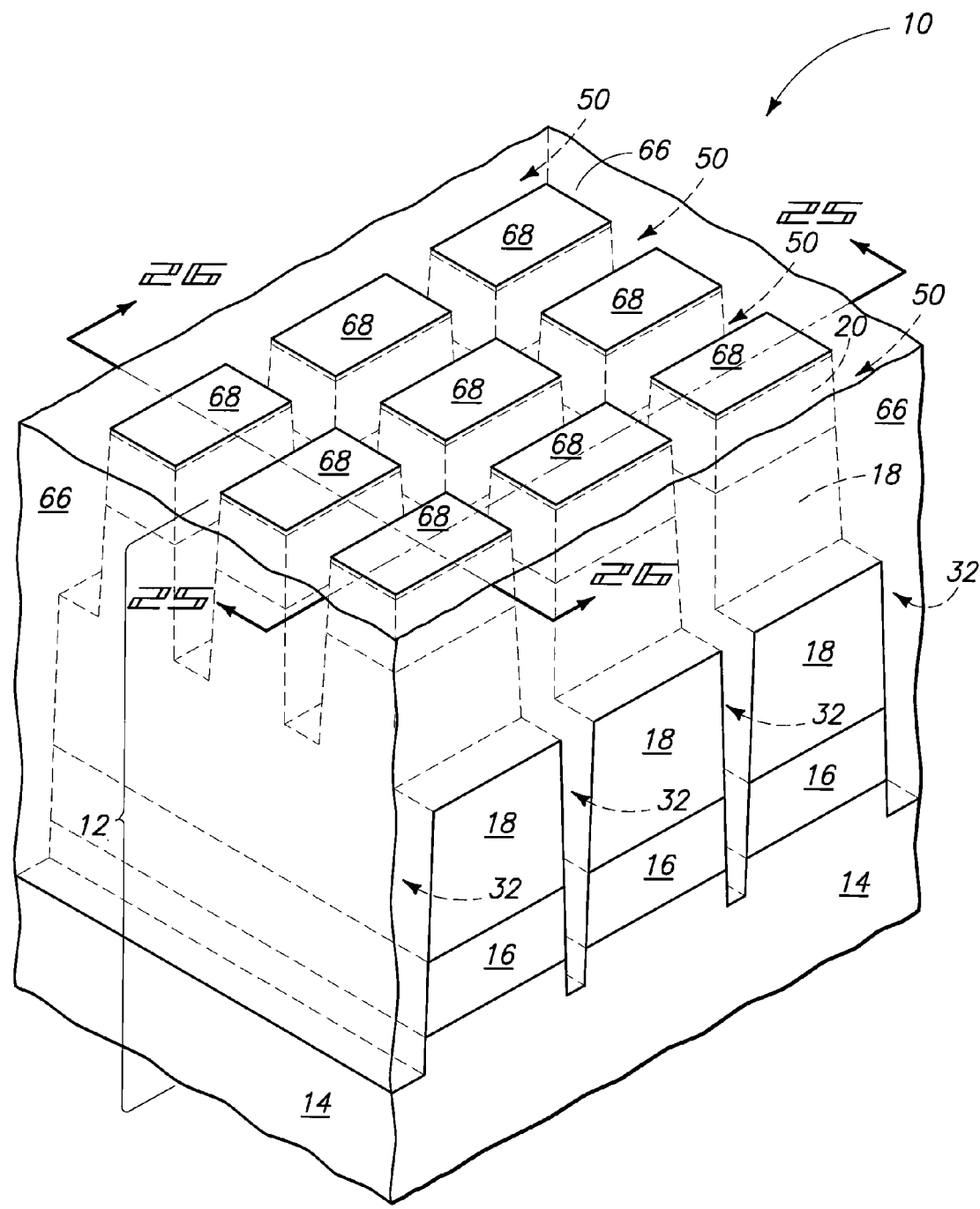
FIG. 24 is a view of the FIG. 21 substrate at a processing subsequent to that shown by FIG. 21.
Figure 25:
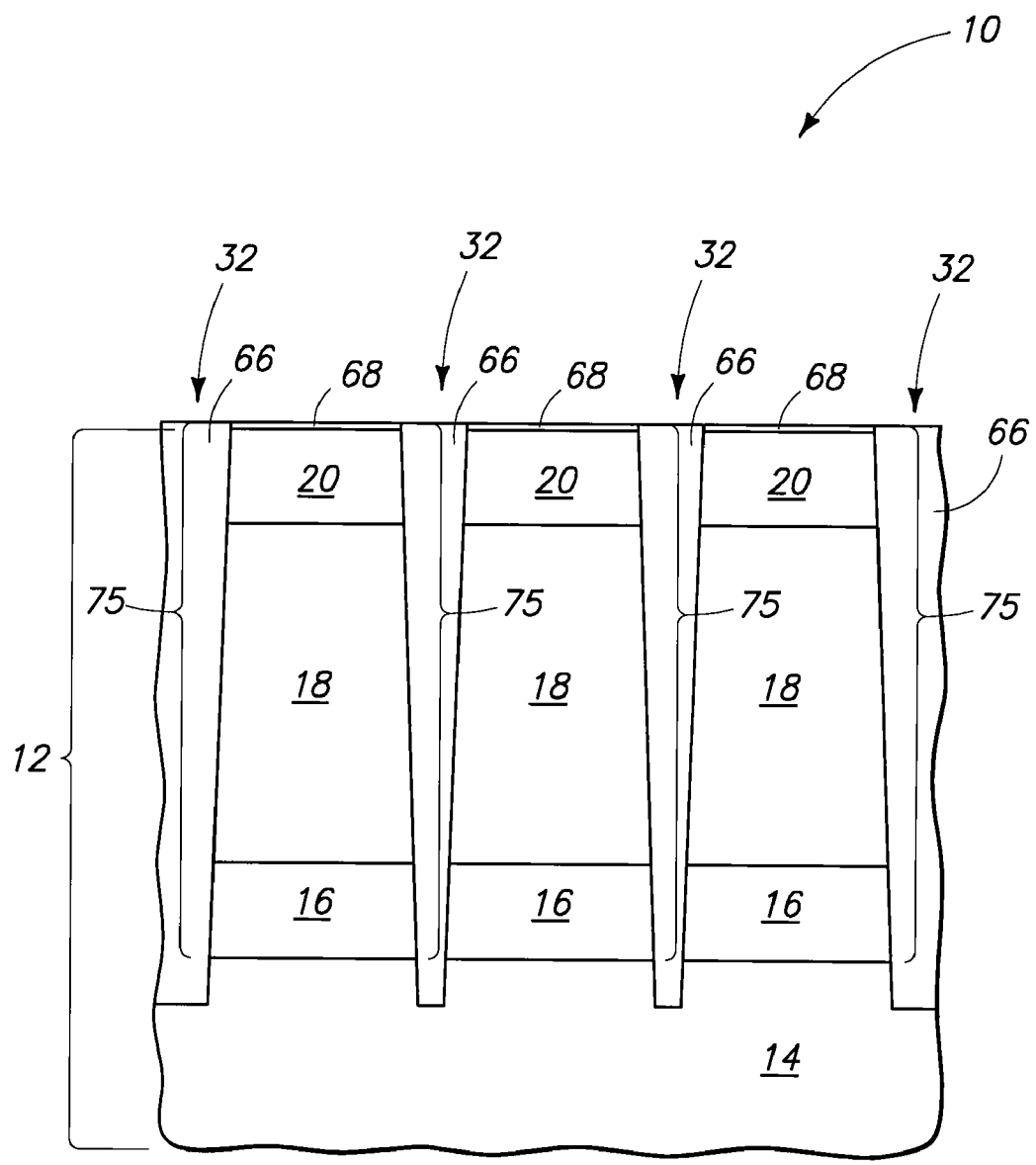
FIG. 25 is a sectional view of the FIG. 25 substrate taken through line 25-25 in FIG. 24.

Regardless, embodiments of the invention also encompass methods of forming a plurality of diodes in conjunction with forming spaced silicon-comprising mesas. For example and by way of example only, FIGS. 24, 25, and 26 depict subsequent processing whereby insulative material 66 has been deposited to be received about spaced silicon-comprising mesas 65 and a conductive silicide layer 68 has been formed over mesas 65. Example insulative materials 66 include one or a combination of silicon nitride and silicon dioxide, and a specific example conductive silicide material 68 includes cobalt silicide. Alternate and/or additional materials might of course be used. The FIGS. 24-26 construction might be fabricated, by way of example only, by deposition of material 66 to overfill the trenches, planarization thereof, and patterning to expose the silicon-comprising mesas, followed by the subsequent salicidation of the exposed silicon material of the mesas.

Regardless, FIGS. 24-26 depict formation of individual example diodes 75 on individual of the spaced silicon-comprising mesas 65. In one embodiment, the individual diodes comprise a p-type silicon-comprising region (i.e., region 20), and an n-type silicon-comprising region (i.e., regions 16, 18). In one embodiment, individual diodes comprise a silicon-comprising region (i.e., region 20) and a metal region (i.e., region 68). By way of example only, the diodes might be used in Programmable Conductive Random Access Memory (PCRAM) applications.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming trench isolation in silicon of a semiconductor substrate, comprising:

forming a first mask over silicon of a semiconductor substrate, the first mask comprising first trenches formed there-through running in a first major direction over the substrate, the first mask comprising a hardmask layer;

plasma etching first trenches into the silicon of the semiconductor substrate using the first mask, the plasma etching of the first trenches into the silicon comprising forming an etching plasma using precursor gases comprising $SF_6$, an oxygen-containing compound, and a nitrogen-containing compound;

forming a second mask over the first trenches, the second mask comprising second trenches formed there-through running in a second major direction over the substrate which is orthogonal to the first major direction, the second mask comprising the hardmask layer of the first mask and not crossing the first trenches;

plasma etching second trenches into the silicon of the semiconductor substrate using the second mask, the plasma etching of the second trenches into the silicon comprising forming an etching plasma using precursor gases comprising $SF_6$, an oxygen-containing compound, and a nitrogen-containing compound; and after plasma etching the second trenches, depositing insulative trench isolation material to within the first and second trenches in the silicon.

2. The method of claim 1 wherein the second mask is formed from multilayer resist received over the hardmask layer of the first mask.

3. The method of claim 1 wherein the hardmask layer of the first mask is insulative.

4. The method of claim 1 wherein the hardmask layer of the first mask is conductive.

5. The method of claim 4 wherein the conductive hardmask layer of the first mask comprises at least one of a refractory metal nitride, a refractory metal suicide, or a metal in elemental-form.

6. The method of claim 1 comprising plasma etching the second trenches to be shallower into the silicon than are the first trenches.

7. A method of forming trench isolation in silicon of a semiconductor substrate, comprising:

forming a first mask over silicon of a semiconductor substrate, the first mask comprising first trenches formed there-through running in a first major direction over the substrate, the first mask comprising a hardmask layer;

plasma etching first trenches into the silicon of the semiconductor substrate using the first mask, the plasma etching of the first trenches into the silicon comprising forming an etching plasma using precursor gases comprising $SF_6$, an oxygen-containing compound, and a nitrogen-containing compound:

forming a second mask over the first trenches, the second mask comprising second trenches formed there-through running in a second major direction over the substrate which is orthogonal to the first major direction, the second mask comprising the hardmask layer of the first mask, plasma etching second trenches into the silicon of the semiconductor substrate using the second mask, the plasma etching of the second trenches into the silicon comprising forming an etching plasma using precursor gases comprising $SF_6$, an oxygen-containing compound, and a nitrogen-containing compound:

after plasma etching the second trenches, depositing insulative trench isolation material to within the first and second trenches in the silicon: and the forming of the second mask comprises filling the first trenches with sacrificial material, and removing the sacrificial material prior to said depositing.

8. The method of claim 7 comprising overfilling the first trenches with the sacrificial material.

9. A method of forming trench isolation in silicon of a semiconductor substrate, comprising:

forming a first mask over silicon of a semiconductor substrate, the first mask comprising first trenches formed there-through running in a first major direction over the substrate, the first mask comprising a hardmask layer;

plasma etching first trenches into the silicon of the semiconductor substrate using the first mask, the plasma etching of the first trenches into the silicon comprising forming an etching plasma using precursor gases comprising $SF_6$, an oxygen-containing compound, and a nitrogen-containing compound;

forming a second mask over the first trenches, the second mask comprising second trenches formed there-through running in a second major direction over the substrate which is orthogonal to the first major direction, the second mask comprising the hardmask layer of the first mask, the forming of the second mask comprising depositing liquid to within the first trenches;

plasma etching second trenches into the silicon of the semiconductor substrate using the second mask, the plasma etching of the second trenches into the silicon comprising forming an etching plasma using precursor gases comprising $SF_6$, an oxygen-containing compound, and a nitrogen-containing compound; and after plasma etching the second trenches, depositing insulative trench isolation material to within the first and second trenches in the silicon.

10. The method of claim 9 wherein the liquid is deposited to fill the first trenches.

11. The method of claim 10 wherein the liquid is deposited to overfill the first trenches.

12. The method of claim 9 comprising:
solidifying the liquid to a solid; and
removing the solid prior to the depositing of insulative trench isolation material to within the first and second trenches.

13. A method of forming trench isolation in silicon of a semiconductor substrate, comprising:

forming a first mask over silicon of a semiconductor substrate, the first mask comprising first trenches formed there-through running in a first major direction over the substrate, the first mask comprising a hardmask layer;

plasma etching first trenches into the silicon of the semiconductor substrate using the first mask, the plasma etching of the first trenches into the silicon comprising an etching plasma comprising a sulfur-containing component, an oxygen-containing component, and $NF_x$;

forming a second mask over the first trenches, the second mask comprising second trenches formed there-through running in a second major direction over the substrate which is orthogonal to the first major direction, the second mask comprising the hardmask layer of the first mask and not crossing the first trenches;

plasma etching second trenches into the silicon of the semiconductor substrate using the second mask, the plasma etching of the second trenches into the silicon comprising an etching plasma comprising a sulfur-containing component, an oxygen-containing component, and $NF_x$; and after plasma etching the second trenches, depositing insulative trench isolation material to within the first and second trenches in the silicon.

14. The method of claim 13 comprising plasma etching the second trenches to be shallower into the silicon than are the first trenches.

15. A method of forming trench isolation in silicon of a semiconductor substrate, comprising:

forming a first mask over silicon of a semiconductor substrate, the first mask comprising first trenches formed there-through running in a first major direction over the substrate, the first mask comprising a hardmask layer;

plasma etching first trenches into the silicon of the semiconductor substrate using the first mask, the plasma etching of the first trenches into the silicon comprising an etching plasma comprising a sulfur-containing component, an oxygen-containing component, and $NF_x$;

forming a second mask over the first trenches, the second mask comprising second trenches formed there-through running in a second major direction over the substrate which is orthogonal to the first major direction, the second mask comprising the hardmask layer of the first mask;

plasma etching second trenches into the silicon of the semiconductor substrate using the second mask, the plasma etching of the second trenches into the silicon comprising an etching plasma comprising a sulfur-containing component, an oxygen-containing component, and $NF_x$;

after plasma etching the second trenches, depositing insulative trench isolation material to within the first and second trenches in the silicon; and the forming of the second mask comprises filling the first trenches with sacrificial material, and removing the sacrificial material prior to said depositing.

16. The method of claim 15 comprising overfilling the first trenches with the sacrificial material.

17. A method of forming trench isolation in silicon of a semiconductor substrate, comprising:

forming a first mask over silicon of a semiconductor substrate, the first mask comprising first trenches formed there-through running in a first major direction over the substrate, the first mask comprising a hardmask layer;

plasma etching first trenches into the silicon of the semiconductor substrate using the first mask, the plasma etching of the first trenches into the silicon comprising an etching plasma comprising a sulfur-containing component, an oxygen-containing component, and $NF_x$;

forming a second mask over the first trenches, the second mask comprising second trenches formed there-through running in a second major direction over the substrate which is orthogonal to the first major direction, the second mask comprising the hardmask layer of the first mask, the forming of the second mask comprising depositing liquid to within the first trenches;

plasma etching second trenches into the silicon of the semiconductor substrate using the second mask, the plasma etching of the second trenches into the silicon comprising an etching plasma comprising a sulfur-containing component, an oxygen-containing component, and $NF_x$; and after plasma etching the second trenches, depositing insulative trench isolation material to within the first and second trenches in the silicon.

18. The method of claim 17 wherein the liquid is deposited to fill the first trenches.

19. The method of claim 18 wherein the liquid is deposited to overfill the first trenches.

20. The method of claim 17 comprising:

solidifying the liquid to a solid; and removing the solid prior to the depositing of insulative trench isolation material to within the first and second trenches.

* * * * *

UNITED STATES PATENT AND TRADEMARK OFFICE
CERTIFICATE OF CORRECTION

PATENT NO. : 7,704,849 B2 Page 1 of 1
APPLICATION NO. : 11/949643
DATED : April 27, 2010
INVENTOR(S) : Krupakar M. Subramanian It is certified that error appears in the above-identified patent and that said Letters Patent is hereby corrected as shown below:

In column 7, line 10, in Claim 5, delete "suicide," and insert -- silicide, --, therefor.

In column 7, line 26, in Claim 7, delete "compound:" and insert -- compound; --, therefor.

In column 7, line 38, in Claim 7, delete "compound:" and insert -- compound; --, therefor.

In column 7, line 41, in Claim 7, delete "silicon:" and insert -- silicon; --, therefor.

Signed and Sealed this

Fifteenth Day of June, 2010

David J. Kappos
*Director of the United States Patent and Trademark Office*